(12) United States Patent
Duparre

(10) Patent No.: US 9,888,194 B2
(45) Date of Patent: Feb. 6, 2018

(54) ARRAY CAMERA ARCHITECTURE IMPLEMENTING QUANTUM FILM IMAGE SENSORS

(71) Applicant: Pelican Imaging Corporation, Santa Clara, CA (US)

(72) Inventor: Jacques Duparre, Jena (DE)

(73) Assignee: FotoNation Cayman Limited, San Jose, CA (US)

( * ) Notice: Subject to any disclaimer, the term of this patent is extended or adjusted under 35 U.S.C. 154(b) by 36 days.

(21) Appl. No.: 14/776,509

(22) PCT Filed: Mar. 11, 2014

(86) PCT No.: PCT/US2014/023762
§ 371 (c)(1),
(2) Date: Sep. 14, 2015

(87) PCT Pub. No.: WO2014/164909
PCT Pub. Date: Oct. 9, 2014

(65) Prior Publication Data
US 2016/0037097 A1   Feb. 4, 2016

Related U.S. Application Data

(60) Provisional application No. 61/780,479, filed on Mar. 13, 2013.

(51) Int. Cl.
*H04N 5/335* (2011.01)
*H04N 5/357* (2011.01)
(Continued)

(52) U.S. Cl.
CPC ............ *H04N 5/3577* (2013.01); *B82Y 30/00* (2013.01); *H01L 27/14645* (2013.01);
(Continued)

(58) Field of Classification Search
CPC .................................................... H04N 5/3577
(Continued)

(56) References Cited

U.S. PATENT DOCUMENTS 4,124,798 A   11/1978   Thompson
4,198,646 A    4/1980   Alexander et al.
(Continued)

FOREIGN PATENT DOCUMENTS

CN   1669332 A   9/2005
CN   1839394 A   9/2006
(Continued)

OTHER PUBLICATIONS

US 8,957,977, 02/2015, Venkataraman et al. (withdrawn)
(Continued)

*Primary Examiner* — Usman Khan
(74) *Attorney, Agent, or Firm* — KPPB LLP

(57) ABSTRACT

Array cameras incorporating quantum film imagers are disclosed. One embodiment includes: a plurality of focal planes, where each focal plane comprises a plurality of rows of pixels that also form a plurality of columns of pixels and each focal plane is contained within a region of the imager array that does not contain pixels from another focal plane; at least one quantum film located on the surface of the imager array, where each quantum film comprises a plurality of quantum dots; control circuitry configured to control the capture of image information by the pixels within the focal planes, where the control circuitry is configured so that the capture of image information by the pixels in at least two of the focal planes is separately controllable; and sampling circuitry configured to convert pixel outputs into digital pixel data.

7 Claims, 12 Drawing Sheets

(51) Int. Cl.
*B82Y 30/00* (2011.01)
*H01L 29/12* (2006.01)
*H01L 27/146* (2006.01)

(52) U.S. Cl.
CPC ...... *H01L 29/127* (2013.01); *H01L 27/14621* (2013.01); *H01L 27/14627* (2013.01)

(58) Field of Classification Search
USPC .......................................................... 348/294
See application file for complete search history.

(56) References Cited

U.S. PATENT DOCUMENTS

| | | | |
|---|---|---|---|
| 4,323,925 A | 4/1982 | Abell et al. |
| 4,460,449 A | 7/1984 | Montalbano |
| 4,467,365 A | 8/1984 | Murayama et al. |
| 4,652,909 A | 3/1987 | Glenn |
| 4,899,060 A | 2/1990 | Lischke |
| 5,005,083 A | 4/1991 | Grage |
| 5,070,414 A | 12/1991 | Tsutsumi |
| 5,144,448 A | 9/1992 | Hornbaker |
| 5,157,499 A | 10/1992 | Oguma et al. |
| 5,325,449 A | 6/1994 | Burt |
| 5,327,125 A | 7/1994 | Iwase et al. |
| 5,488,674 A | 1/1996 | Burt |
| 5,629,524 A | 5/1997 | Stettner et al. |
| 5,793,900 A | 8/1998 | Nourbakhsh et al. |
| 5,801,919 A | 9/1998 | Griencewic et al. |
| 5,808,350 A | 9/1998 | Jack et al. |
| 5,832,312 A | 11/1998 | Rieger et al. |
| 5,833,507 A | 11/1998 | Woodgate et al. |
| 5,880,691 A | 3/1999 | Fossum et al. |
| 5,911,008 A | 6/1999 | Niikura et al. |
| 5,933,190 A | 8/1999 | Dierickx et al. |
| 5,973,844 A | 10/1999 | Burger |
| 6,002,743 A | 12/1999 | Telymonde |
| 6,005,607 A | 12/1999 | Uomori et al. |
| 6,034,690 A | 3/2000 | Gallery et al. |
| 6,069,351 A | 5/2000 | Mack |
| 6,069,365 A | 5/2000 | Chow et al. |
| 6,097,394 A | 8/2000 | Levoy et al. |
| 6,124,974 A | 9/2000 | Burger |
| 6,130,786 A | 10/2000 | Osawa et al. |
| 6,137,100 A | 10/2000 | Fossum et al. |
| 6,137,535 A | 10/2000 | Meyers |
| 6,141,048 A | 10/2000 | Meyers |
| 6,160,909 A | 12/2000 | Melen |
| 6,163,414 A | 12/2000 | Kikuchi et al. |
| 6,172,352 B1 | 1/2001 | Liu et al. |
| 6,175,379 B1 | 1/2001 | Uomori et al. |
| 6,205,241 B1 | 3/2001 | Melen |
| 6,239,909 B1 | 5/2001 | Hayashi et al. |
| 6,292,713 B1 | 9/2001 | Jouppi et al. |
| 6,340,994 B1 | 1/2002 | Margulis et al. |
| 6,358,862 B1 | 3/2002 | Ireland et al. |
| 6,443,579 B1 | 9/2002 | Myers et al. |
| 6,476,805 B1 | 11/2002 | Shum et al. |
| 6,477,260 B1 | 11/2002 | Shimomura |
| 6,502,097 B1 | 12/2002 | Chan et al. |
| 6,525,302 B2 | 2/2003 | Dowski, Jr. et al. |
| 6,563,537 B1 | 5/2003 | Kawamura et al. |
| 6,571,466 B1 | 6/2003 | Glenn et al. |
| 6,603,513 B1 | 8/2003 | Berezin |
| 6,611,289 B1 | 8/2003 | Yu |
| 6,627,896 B1 | 9/2003 | Hashimoto et al. |
| 6,628,330 B1 | 9/2003 | Lin |
| 6,635,941 B2 | 10/2003 | Suda |
| 6,639,596 B1 | 10/2003 | Shum et al. |
| 6,647,142 B1 | 11/2003 | Beardsley |
| 6,657,218 B2 | 12/2003 | Noda |
| 6,671,399 B1 | 12/2003 | Berestov |
| 6,674,892 B1 | 1/2004 | Melen et al. |
| 6,750,904 B1 | 6/2004 | Lambert |
| 6,765,617 B1 | 7/2004 | Tangen et al. |
| 6,771,833 B1 | 8/2004 | Edgar |
| 6,774,941 B1 | 8/2004 | Boisvert et al. |
| 6,788,338 B1 | 9/2004 | Dinev |
| 6,795,253 B2 | 9/2004 | Shinohara |
| 6,801,653 B1 | 10/2004 | Wu et al. |
| 6,819,328 B1 | 11/2004 | Moriwaki et al. |
| 6,819,358 B1 | 11/2004 | Kagle et al. |
| 6,879,735 B1 | 4/2005 | Portniaguine et al. |
| 6,897,454 B2 | 5/2005 | Sasaki et al. |
| 6,903,770 B1 | 6/2005 | Kobayashi et al. |
| 6,909,121 B2 | 6/2005 | Nishikawa |
| 6,927,922 B2 | 8/2005 | George et al. |
| 6,958,862 B1 | 10/2005 | Joseph |
| 7,015,954 B1 | 3/2006 | Foote et al. |
| 7,085,409 B2 | 8/2006 | Sawhney et al. |
| 7,161,614 B1 | 1/2007 | Yamashita et al. |
| 7,199,348 B2 | 4/2007 | Olsen et al. |
| 7,206,449 B2 | 4/2007 | Raskar et al. |
| 7,235,785 B2 | 6/2007 | Hornback et al. |
| 7,262,799 B2 | 8/2007 | Suda |
| 7,292,735 B2 | 11/2007 | Blake et al. |
| 7,295,697 B1 | 11/2007 | Satoh |
| 7,333,651 B1 | 2/2008 | Kim et al. |
| 7,369,165 B2 | 5/2008 | Bosco et al. |
| 7,391,572 B2 | 6/2008 | Jacobowitz et al. |
| 7,408,725 B2 | 8/2008 | Sato |
| 7,425,984 B2 | 9/2008 | Chen |
| 7,430,312 B2 | 9/2008 | Gu |
| 7,496,293 B2 | 2/2009 | Shamir et al. |
| 7,564,019 B2 | 7/2009 | Olsen |
| 7,599,547 B2 | 10/2009 | Sun et al. |
| 7,606,484 B1 | 10/2009 | Richards et al. |
| 7,620,265 B1 | 11/2009 | Wolff |
| 7,633,511 B2 | 12/2009 | Shum et al. |
| 7,639,435 B2 | 12/2009 | Chiang et al. |
| 7,646,549 B2 | 1/2010 | Zalevsky et al. |
| 7,657,090 B2 | 2/2010 | Omatsu et al. |
| 7,675,080 B2 | 3/2010 | Boettiger |
| 7,675,681 B2 | 3/2010 | Tomikawa et al. |
| 7,706,634 B2 | 4/2010 | Schmitt et al. |
| 7,723,662 B2 | 5/2010 | Levoy et al. |
| 7,738,013 B2 | 6/2010 | Galambos et al. |
| 7,741,620 B2 | 6/2010 | Doering et al. |
| 7,782,364 B2 | 8/2010 | Smith |
| 7,826,153 B2 | 11/2010 | Hong |
| 7,840,067 B2 | 11/2010 | Shen et al. |
| 7,912,673 B2 | 3/2011 | Hébert et al. |
| 7,965,314 B1 | 6/2011 | Miller et al. |
| 7,973,834 B2 | 7/2011 | Yang |
| 7,986,018 B2 | 7/2011 | Rennie |
| 7,990,447 B2 | 8/2011 | Honda et al. |
| 8,000,498 B2 | 8/2011 | Shih et al. |
| 8,013,904 B2 | 9/2011 | Tan et al. |
| 8,027,531 B2 | 9/2011 | Wilburn et al. |
| 8,044,994 B2 | 10/2011 | Vetro et al. |
| 8,077,245 B2 | 12/2011 | Adamo et al. |
| 8,098,297 B2 | 1/2012 | Crisan et al. |
| 8,098,304 B2 | 1/2012 | Pinto et al. |
| 8,106,949 B2 | 1/2012 | Tan et al. |
| 8,126,279 B2 | 2/2012 | Marcellin et al. |
| 8,130,120 B2 | 3/2012 | Kawabata et al. |
| 8,131,097 B2 | 3/2012 | Lelescu et al. |
| 8,149,323 B2 | 4/2012 | Li |
| 8,164,629 B1 | 4/2012 | Zhang |
| 8,169,486 B2 | 5/2012 | Corcoran et al. |
| 8,180,145 B2 | 5/2012 | Wu et al. |
| 8,189,065 B2 | 5/2012 | Georgiev et al. |
| 8,189,089 B1 | 5/2012 | Georgiev |
| 8,194,296 B2 | 6/2012 | Compton |
| 8,212,914 B2 | 7/2012 | Chiu |
| 8,213,711 B2 | 7/2012 | Tam |
| 8,231,814 B2 | 7/2012 | Duparre |
| 8,242,426 B2 | 8/2012 | Ward et al. |
| 8,244,027 B2 | 8/2012 | Takahashi |
| 8,244,058 B1 | 8/2012 | Intwala et al. |
| 8,254,668 B2 | 8/2012 | Mashitani et al. |
| 8,279,325 B2 | 10/2012 | Pitts et al. |
| 8,280,194 B2 | 10/2012 | Wong et al. |
| 8,284,240 B2 | 10/2012 | Saint-Pierre et al. |
| 8,289,409 B2 | 10/2012 | Chang |

(56) References Cited

U.S. PATENT DOCUMENTS

| | | |
|---|---|---|
| 8,289,440 B2 | 10/2012 | Pitts et al. |
| 8,290,358 B1 | 10/2012 | Georgiev |
| 8,294,099 B2 | 10/2012 | Blackwell, Jr. |
| 8,294,754 B2 | 10/2012 | Jung et al. |
| 8,300,085 B2 | 10/2012 | Yang et al. |
| 8,305,456 B1 | 11/2012 | McMahon |
| 8,315,476 B1 | 11/2012 | Georgiev et al. |
| 8,345,144 B1 | 1/2013 | Georgiev et al. |
| 8,360,574 B2 | 1/2013 | Ishak et al. |
| 8,400,555 B1 | 3/2013 | Georgiev |
| 8,406,562 B2 | 3/2013 | Bassi et al. |
| 8,411,146 B2 | 4/2013 | Twede |
| 8,446,492 B2 | 5/2013 | Nakano et al. |
| 8,456,517 B2 | 6/2013 | Mor et al. |
| 8,493,496 B2 | 7/2013 | Freedman et al. |
| 8,514,291 B2 | 8/2013 | Chang et al. |
| 8,514,491 B2 | 8/2013 | Duparre |
| 8,541,730 B2 | 9/2013 | Inuiya |
| 8,542,933 B2 | 9/2013 | Venkataraman et al. |
| 8,553,093 B2 | 10/2013 | Wong et al. |
| 8,559,756 B2 | 10/2013 | Georgiev et al. |
| 8,565,547 B2 | 10/2013 | Strandemar |
| 8,576,302 B2 | 11/2013 | Yoshikawa |
| 8,577,183 B2 | 11/2013 | Robinson |
| 8,581,995 B2 | 11/2013 | Lin et al. |
| 8,619,082 B1 | 12/2013 | Ciurea et al. |
| 8,648,918 B2 | 2/2014 | Kauker et al. |
| 8,655,052 B2 | 2/2014 | Spooner et al. |
| 8,682,107 B2 | 3/2014 | Yoon et al. |
| 8,687,087 B2 | 4/2014 | Pertsel et al. |
| 8,692,893 B2 | 4/2014 | McMahon |
| 8,754,941 B1 | 6/2014 | Sarwari et al. |
| 8,773,536 B1 | 7/2014 | Zhang |
| 8,780,113 B1 | 7/2014 | Ciurea et al. |
| 8,804,255 B2 | 8/2014 | Duparre |
| 8,830,375 B2 | 9/2014 | Ludwig |
| 8,831,367 B2 | 9/2014 | Venkataraman et al. |
| 8,836,793 B1 | 9/2014 | Kriesel et al. |
| 8,842,201 B2 | 9/2014 | Tajiri |
| 8,854,462 B2 | 10/2014 | Herbin et al. |
| 8,861,089 B2 | 10/2014 | Duparre |
| 8,866,912 B2 | 10/2014 | Mullis |
| 8,866,920 B2 | 10/2014 | Venkataraman et al. |
| 8,866,951 B2 | 10/2014 | Keelan |
| 8,878,950 B2 | 11/2014 | Lelescu et al. |
| 8,885,059 B1 | 11/2014 | Venkataraman et al. |
| 8,885,922 B2 | 11/2014 | Ito et al. |
| 8,896,594 B2 | 11/2014 | Xiong et al. |
| 8,896,719 B1 | 11/2014 | Venkataraman et al. |
| 8,902,321 B2 | 12/2014 | Venkataraman et al. |
| 8,928,793 B2 | 1/2015 | Mcmahon |
| 8,977,038 B2 | 3/2015 | Tian et al. |
| 9,001,226 B1 | 4/2015 | Ng et al. |
| 9,019,426 B2 | 4/2015 | Han et al. |
| 9,025,894 B2 | 5/2015 | Venkataraman et al. |
| 9,025,895 B2 | 5/2015 | Venkataraman et al. |
| 9,030,528 B2 | 5/2015 | Pesach et al. |
| 9,031,335 B2 | 5/2015 | Venkataraman et al. |
| 9,031,342 B2 | 5/2015 | Venkataraman et al. |
| 9,031,343 B2 | 5/2015 | Venkataraman et al. |
| 9,036,928 B2 | 5/2015 | Venkataraman et al. |
| 9,036,931 B2 | 5/2015 | Venkataraman et al. |
| 9,041,823 B2 | 5/2015 | Venkataraman et al. |
| 9,041,824 B2 | 5/2015 | Lelescu et al. |
| 9,041,829 B2 | 5/2015 | Venkataraman et al. |
| 9,042,667 B2 | 5/2015 | Venkataraman et al. |
| 9,049,367 B2 | 6/2015 | Venkataraman et al. |
| 9,055,233 B2 | 6/2015 | Venkatarama et al. |
| 9,060,124 B2 | 6/2015 | Venkataraman et al. |
| 9,077,893 B2 | 7/2015 | Venkataraman et al. |
| 9,094,661 B2 | 7/2015 | Venkataraman et al. |
| 9,123,117 B2 | 9/2015 | Ciurea et al. |
| 9,123,118 B2 | 9/2015 | Ciurea et al. |
| 9,124,815 B2 | 9/2015 | Venkataraman et al. |
| 9,124,831 B2 | 9/2015 | Mullis |
| 9,124,864 B2 | 9/2015 | Mullis |
| 9,128,228 B2 | 9/2015 | Duparre |
| 9,129,183 B2 | 9/2015 | Venkataraman et al. |
| 9,129,377 B2 | 9/2015 | Ciurea et al. |
| 9,143,711 B2 | 9/2015 | McMahon |
| 9,147,254 B2 | 9/2015 | Ciurea et al. |
| 9,185,276 B2 | 11/2015 | Rodda et al. |
| 9,188,765 B2 | 11/2015 | Venkataraman et al. |
| 9,191,580 B2 | 11/2015 | Venkataraman et al. |
| 9,197,821 B2 | 11/2015 | McMahon |
| 9,210,392 B2 | 12/2015 | Nisenzon et al. |
| 9,214,013 B2 | 12/2015 | Venkataraman et al. |
| 9,235,898 B2 | 1/2016 | Venkataraman et al. |
| 9,235,900 B2 | 1/2016 | Ciurea et al. |
| 9,240,049 B2 | 1/2016 | Ciurea et al. |
| 9,253,380 B2 | 2/2016 | Venkataraman et al. |
| 9,256,974 B1 | 2/2016 | Hines |
| 9,264,592 B2 | 2/2016 | Rodda et al. |
| 9,264,610 B2 | 2/2016 | Duparre |
| 9,361,662 B2 | 6/2016 | Lelescu et al. |
| 9,412,206 B2 | 8/2016 | McMahon et al. |
| 9,413,953 B2 | 8/2016 | Maeda |
| 9,426,343 B2 | 8/2016 | Rodda et al. |
| 9,426,361 B2 | 8/2016 | Venkataraman et al. |
| 9,438,888 B2 | 9/2016 | Venkataraman et al. |
| 9,445,003 B1 | 9/2016 | Lelescu et al. |
| 9,456,134 B2 | 9/2016 | Venkataraman et al. |
| 9,456,196 B2 | 9/2016 | Kim et al. |
| 9,462,164 B2 | 10/2016 | Venkataraman et al. |
| 9,485,496 B2 | 11/2016 | Venkataraman et al. |
| 9,497,370 B2 | 11/2016 | Venkataraman et al. |
| 9,497,429 B2 | 11/2016 | Mullis et al. |
| 9,516,222 B2 | 12/2016 | Duparre et al. |
| 9,519,972 B2 | 12/2016 | Venkataraman et al. |
| 9,521,319 B2 | 12/2016 | Rodda et al. |
| 9,521,416 B1 | 12/2016 | McMahon et al. |
| 9,536,166 B2 | 1/2017 | Venkataraman et al. |
| 9,576,369 B2 | 2/2017 | Venkataraman et al. |
| 9,578,237 B2 | 2/2017 | Duparre et al. |
| 9,578,259 B2 | 2/2017 | Molina |
| 9,602,805 B2 | 3/2017 | Venkataraman et al. |
| 9,635,274 B2 | 4/2017 | Lin et al. |
| 9,638,883 B1 | 5/2017 | Duparre |
| 9,661,310 B2 | 5/2017 | Deng et al. |
| 9,706,132 B2 | 7/2017 | Nisenzon et al. |
| 9,712,759 B2 | 7/2017 | Venkataraman et al. |
| 9,749,547 B2 | 8/2017 | Venkataraman et al. |
| 9,749,568 B2 | 8/2017 | McMahon |
| 9,754,422 B2 | 9/2017 | McMahon et al. |
| 9,769,365 B1 | 9/2017 | Jannard |
| 9,774,831 B2 | 9/2017 | Venkataraman et al. |
| 2001/0005225 A1 | 6/2001 | Clark et al. |
| 2001/0019621 A1 | 9/2001 | Hanna et al. |
| 2001/0028038 A1 | 10/2001 | Hamaguchi et al. |
| 2001/0038387 A1 | 11/2001 | Tomooka et al. |
| 2002/0012056 A1 | 1/2002 | Trevino |
| 2002/0015536 A1 | 2/2002 | Warren |
| 2002/0027608 A1 | 3/2002 | Johnson |
| 2002/0028014 A1 | 3/2002 | Ono et al. |
| 2002/0039438 A1 | 4/2002 | Mori et al. |
| 2002/0057845 A1 | 5/2002 | Fossum |
| 2002/0061131 A1 | 5/2002 | Sawhney et al. |
| 2002/0063807 A1 | 5/2002 | Margulis |
| 2002/0075450 A1 | 6/2002 | Aratani |
| 2002/0087403 A1 | 7/2002 | Meyers et al. |
| 2002/0089596 A1 | 7/2002 | Suda |
| 2002/0094027 A1 | 7/2002 | Sato et al. |
| 2002/0101528 A1 | 8/2002 | Lee |
| 2002/0113867 A1 | 8/2002 | Takigawa et al. |
| 2002/0113888 A1 | 8/2002 | Sonoda et al. |
| 2002/0120634 A1 | 8/2002 | Min et al. |
| 2002/0122113 A1 | 9/2002 | Foote et al. |
| 2002/0163054 A1 | 11/2002 | Suda et al. |
| 2002/0167537 A1 | 11/2002 | Trajkovic |
| 2002/0177054 A1 | 11/2002 | Saitoh et al. |
| 2002/0190991 A1 | 12/2002 | Efran et al. |
| 2002/0195548 A1 | 12/2002 | Dowski, Jr. et al. |
| 2003/0025227 A1 | 2/2003 | Daniell |
| 2003/0086079 A1 | 5/2003 | Barth et al. |

(56) References Cited

U.S. PATENT DOCUMENTS

| | | |
|---|---|---|
| 2003/0124763 A1 | 7/2003 | Fan et al. |
| 2003/0140347 A1 | 7/2003 | Varsa |
| 2003/0179418 A1 | 9/2003 | Wengender et al. |
| 2003/0188659 A1 | 10/2003 | Merry et al. |
| 2003/0190072 A1 | 10/2003 | Adkins et al. |
| 2003/0198377 A1 | 10/2003 | Ng et al. |
| 2003/0211405 A1 | 11/2003 | Venkataraman |
| 2004/0003409 A1 | 1/2004 | Berstis et al. |
| 2004/0008271 A1 | 1/2004 | Hagimori et al. |
| 2004/0012689 A1 | 1/2004 | Tinnerino |
| 2004/0027358 A1 | 2/2004 | Nakao |
| 2004/0047274 A1 | 3/2004 | Amanai |
| 2004/0050104 A1 | 3/2004 | Ghosh et al. |
| 2004/0056966 A1 | 3/2004 | Schechner et al. |
| 2004/0061787 A1 | 4/2004 | Liu et al. |
| 2004/0066454 A1 | 4/2004 | Otani et al. |
| 2004/0071367 A1 | 4/2004 | Irani et al. |
| 2004/0075654 A1 | 4/2004 | Hsiao et al. |
| 2004/0096119 A1 | 5/2004 | Williams |
| 2004/0100570 A1 | 5/2004 | Shizukuishi |
| 2004/0105021 A1 | 6/2004 | Hu et al. |
| 2004/0114807 A1 | 6/2004 | Lelescu et al. |
| 2004/0141659 A1 | 7/2004 | Zhang et al. |
| 2004/0151401 A1 | 8/2004 | Sawhney et al. |
| 2004/0165090 A1 | 8/2004 | Ning |
| 2004/0169617 A1 | 9/2004 | Yelton et al. |
| 2004/0170340 A1 | 9/2004 | Tipping et al. |
| 2004/0174439 A1 | 9/2004 | Upton |
| 2004/0179008 A1 | 9/2004 | Gordon et al. |
| 2004/0179834 A1 | 9/2004 | Szajewski |
| 2004/0196379 A1 | 10/2004 | Chen et al. |
| 2004/0207836 A1 | 10/2004 | Chhibber et al. |
| 2004/0213449 A1 | 10/2004 | Safaee-Rad et al. |
| 2004/0218809 A1 | 11/2004 | Blake et al. |
| 2004/0234873 A1 | 11/2004 | Venkataraman |
| 2004/0239885 A1 | 12/2004 | Jaynes et al. |
| 2004/0240052 A1 | 12/2004 | Minefuji et al. |
| 2004/0251509 A1 | 12/2004 | Choi |
| 2004/0264806 A1 | 12/2004 | Herley |
| 2005/0006477 A1 | 1/2005 | Patel |
| 2005/0007461 A1 | 1/2005 | Chou et al. |
| 2005/0009313 A1 | 1/2005 | Suzuki et al. |
| 2005/0010621 A1 | 1/2005 | Pinto et al. |
| 2005/0012035 A1 | 1/2005 | Miller |
| 2005/0036778 A1 | 2/2005 | DeMonte |
| 2005/0047678 A1 | 3/2005 | Jones et al. |
| 2005/0048690 A1 | 3/2005 | Yamamoto |
| 2005/0068436 A1 | 3/2005 | Fraenkel et al. |
| 2005/0083531 A1 | 4/2005 | Millerd et al. |
| 2005/0128509 A1 | 6/2005 | Tokkonen et al. |
| 2005/0128595 A1 | 6/2005 | Shimizu |
| 2005/0132098 A1 | 6/2005 | Sonoda et al. |
| 2005/0134698 A1 | 6/2005 | Schroeder |
| 2005/0134699 A1 | 6/2005 | Nagashima |
| 2005/0134712 A1 | 6/2005 | Gruhlke et al. |
| 2005/0147277 A1 | 7/2005 | Higaki et al. |
| 2005/0151759 A1 | 7/2005 | Gonzalez-Banos et al. |
| 2005/0168924 A1 | 8/2005 | Wu et al. |
| 2005/0175257 A1 | 8/2005 | Kuroki |
| 2005/0185711 A1 | 8/2005 | Pfister et al. |
| 2005/0205785 A1 | 9/2005 | Hornback et al. |
| 2005/0219264 A1 | 10/2005 | Shum et al. |
| 2005/0219363 A1 | 10/2005 | Kohler |
| 2005/0224843 A1 | 10/2005 | Boemler |
| 2005/0225654 A1 | 10/2005 | Feldman et al. |
| 2005/0265633 A1 | 12/2005 | Piacentino |
| 2005/0275946 A1 | 12/2005 | Choo et al. |
| 2005/0286612 A1 | 12/2005 | Takanashi |
| 2005/0286756 A1 | 12/2005 | Hong et al. |
| 2006/0002635 A1 | 1/2006 | Nestares et al. |
| 2006/0007331 A1 | 1/2006 | Izumi et al. |
| 2006/0018509 A1 | 1/2006 | Miyoshi |
| 2006/0023197 A1 | 2/2006 | Joel |
| 2006/0023314 A1 | 2/2006 | Boettiger et al. |
| 2006/0028476 A1 | 2/2006 | Sobel et al. |
| 2006/0029270 A1 | 2/2006 | Berestov et al. |
| 2006/0029271 A1 | 2/2006 | Miyoshi et al. |
| 2006/0033005 A1 | 2/2006 | Jerdev et al. |
| 2006/0034003 A1 | 2/2006 | Zalevsky |
| 2006/0034531 A1 | 2/2006 | Poon et al. |
| 2006/0035415 A1 | 2/2006 | Wood |
| 2006/0038891 A1 | 2/2006 | Okutomi et al. |
| 2006/0039611 A1 | 2/2006 | Rother |
| 2006/0046204 A1 | 3/2006 | Ono et al. |
| 2006/0049930 A1 | 3/2006 | Zruya et al. |
| 2006/0054780 A1 | 3/2006 | Garrood et al. |
| 2006/0054782 A1 | 3/2006 | Olsen et al. |
| 2006/0055811 A1 | 3/2006 | Frtiz et al. |
| 2006/0069478 A1 | 3/2006 | Iwama |
| 2006/0072029 A1 | 4/2006 | Miyatake et al. |
| 2006/0087747 A1 | 4/2006 | Ohzawa et al. |
| 2006/0098888 A1 | 5/2006 | Morishita |
| 2006/0103754 A1 | 5/2006 | Wenstrand et al. |
| 2006/0125936 A1 | 6/2006 | Gruhike et al. |
| 2006/0138322 A1 | 6/2006 | Costello et al. |
| 2006/0152803 A1 | 7/2006 | Provitola |
| 2006/0157640 A1 | 7/2006 | Perlman et al. |
| 2006/0159369 A1 | 7/2006 | Young |
| 2006/0176566 A1 | 8/2006 | Boettiger et al. |
| 2006/0187338 A1 | 8/2006 | May et al. |
| 2006/0197937 A1 | 9/2006 | Bamji et al. |
| 2006/0203100 A1 | 9/2006 | Ajito et al. |
| 2006/0203113 A1 | 9/2006 | Wada et al. |
| 2006/0210146 A1 | 9/2006 | Gu |
| 2006/0210186 A1 | 9/2006 | Berkner |
| 2006/0214085 A1 | 9/2006 | Olsen |
| 2006/0221250 A1 | 10/2006 | Rossbach et al. |
| 2006/0239549 A1 | 10/2006 | Kelly et al. |
| 2006/0243889 A1 | 11/2006 | Farnworth et al. |
| 2006/0251410 A1 | 11/2006 | Trutna |
| 2006/0274174 A1 | 12/2006 | Tewinkle |
| 2006/0278948 A1 | 12/2006 | Yamaguchi et al. |
| 2006/0279648 A1 | 12/2006 | Senba et al. |
| 2006/0289772 A1 | 12/2006 | Johnson et al. |
| 2007/0002159 A1 | 1/2007 | Olsen et al. |
| 2007/0008575 A1 | 1/2007 | Yu et al. |
| 2007/0009150 A1 | 1/2007 | Suwa |
| 2007/0024614 A1 | 2/2007 | Tam |
| 2007/0030356 A1 | 2/2007 | Yea et al. |
| 2007/0035707 A1 | 2/2007 | Margulis |
| 2007/0036427 A1 | 2/2007 | Nakamura et al. |
| 2007/0040828 A1 | 2/2007 | Zalevsky et al. |
| 2007/0040922 A1 | 2/2007 | McKee et al. |
| 2007/0041391 A1 | 2/2007 | Lin et al. |
| 2007/0052825 A1 | 3/2007 | Cho |
| 2007/0083114 A1 | 4/2007 | Yang et al. |
| 2007/0085917 A1 | 4/2007 | Kobayashi |
| 2007/0092245 A1 | 4/2007 | Bazakos et al. |
| 2007/0102622 A1 | 5/2007 | Olsen et al. |
| 2007/0126898 A1 | 6/2007 | Feldman |
| 2007/0127831 A1 | 6/2007 | Venkataraman |
| 2007/0139333 A1 | 6/2007 | Sato et al. |
| 2007/0140685 A1 | 6/2007 | Wu et al. |
| 2007/0146503 A1 | 6/2007 | Shiraki |
| 2007/0146511 A1 | 6/2007 | Kinoshita et al. |
| 2007/0153335 A1 | 7/2007 | Irani et al. |
| 2007/0158427 A1 | 7/2007 | Zhu et al. |
| 2007/0159541 A1 | 7/2007 | Sparks et al. |
| 2007/0160310 A1 | 7/2007 | Tanida et al. |
| 2007/0165931 A1 | 7/2007 | Higaki |
| 2007/0171290 A1 | 7/2007 | Kroger |
| 2007/0177004 A1 | 8/2007 | Kolehmainen et al. |
| 2007/0182843 A1 | 8/2007 | Shimamura et al. |
| 2007/0201859 A1 | 8/2007 | Sarrat et al. |
| 2007/0206241 A1 | 9/2007 | Smith et al. |
| 2007/0211164 A1 | 9/2007 | Olsen et al. |
| 2007/0216765 A1 | 9/2007 | Wong et al. |
| 2007/0228256 A1 | 10/2007 | Mentzer |
| 2007/0236595 A1 | 10/2007 | Pan et al. |
| 2007/0247517 A1 | 10/2007 | Zhang et al. |
| 2007/0257184 A1 | 11/2007 | Olsen et al. |
| 2007/0258006 A1 | 11/2007 | Olsen et al. |
| 2007/0258706 A1 | 11/2007 | Raskar et al. |
| 2007/0263113 A1 | 11/2007 | Baek et al. |

(56) References Cited

U.S. PATENT DOCUMENTS

| | | |
|---|---|---|
| 2007/0263114 A1 | 11/2007 | Gurevich et al. |
| 2007/0268374 A1 | 11/2007 | Robinson |
| 2007/0296832 A1 | 12/2007 | Ota et al. |
| 2007/0296835 A1 | 12/2007 | Olsen |
| 2007/0296847 A1 | 12/2007 | Chang et al. |
| 2007/0297696 A1 | 12/2007 | Hamza |
| 2008/0006859 A1 | 1/2008 | Mionetto et al. |
| 2008/0019611 A1 | 1/2008 | Larkin |
| 2008/0024683 A1 | 1/2008 | Damera-Venkata et al. |
| 2008/0025649 A1 | 1/2008 | Liu et al. |
| 2008/0030592 A1 | 2/2008 | Border et al. |
| 2008/0030597 A1 | 2/2008 | Olsen et al. |
| 2008/0043095 A1 | 2/2008 | Vetro et al. |
| 2008/0043096 A1 | 2/2008 | Vetro et al. |
| 2008/0054518 A1 | 3/2008 | Ra et al. |
| 2008/0056302 A1 | 3/2008 | Erdal et al. |
| 2008/0062164 A1 | 3/2008 | Bassi et al. |
| 2008/0079805 A1 | 4/2008 | Takagi et al. |
| 2008/0080028 A1 | 4/2008 | Bakin et al. |
| 2008/0084486 A1 | 4/2008 | Enge et al. |
| 2008/0088793 A1 | 4/2008 | Sverdrup et al. |
| 2008/0095523 A1 | 4/2008 | Schilling-Benz et al. |
| 2008/0099804 A1 | 5/2008 | Venezia et al. |
| 2008/0106620 A1 | 5/2008 | Sawachi et al. |
| 2008/0112059 A1 | 5/2008 | Choi et al. |
| 2008/0112635 A1 | 5/2008 | Kondo et al. |
| 2008/0118241 A1 | 5/2008 | Tekolste et al. |
| 2008/0131019 A1 | 6/2008 | Ng |
| 2008/0131107 A1 | 6/2008 | Ueno |
| 2008/0151097 A1 | 6/2008 | Chen et al. |
| 2008/0152215 A1 | 6/2008 | Horie et al. |
| 2008/0152296 A1 | 6/2008 | Oh et al. |
| 2008/0156991 A1 | 7/2008 | Hu et al. |
| 2008/0158259 A1 | 7/2008 | Kempf et al. |
| 2008/0158375 A1 | 7/2008 | Kakkori et al. |
| 2008/0158698 A1 | 7/2008 | Chang et al. |
| 2008/0165257 A1 | 7/2008 | Boettiger et al. |
| 2008/0174670 A1 | 7/2008 | Olsen et al. |
| 2008/0187305 A1 | 8/2008 | Raskar et al. |
| 2008/0193026 A1 | 8/2008 | Horie et al. |
| 2008/0211737 A1 | 9/2008 | Kim et al. |
| 2008/0218610 A1 | 9/2008 | Chapman et al. |
| 2008/0218611 A1 | 9/2008 | Parulski et al. |
| 2008/0218612 A1 | 9/2008 | Border et al. |
| 2008/0218613 A1 | 9/2008 | Janson et al. |
| 2008/0219654 A1 | 9/2008 | Border et al. |
| 2008/0239116 A1 | 10/2008 | Smith |
| 2008/0240598 A1 | 10/2008 | Hasegawa |
| 2008/0247638 A1 | 10/2008 | Tanida et al. |
| 2008/0247653 A1 | 10/2008 | Moussavi et al. |
| 2008/0272416 A1 | 11/2008 | Yun |
| 2008/0273751 A1 | 11/2008 | Yuan et al. |
| 2008/0278591 A1 | 11/2008 | Barna et al. |
| 2008/0278610 A1 | 11/2008 | Boettiger et al. |
| 2008/0284880 A1 | 11/2008 | Numata |
| 2008/0291295 A1 | 11/2008 | Kato et al. |
| 2008/0298674 A1 | 12/2008 | Baker et al. |
| 2008/0310501 A1 | 12/2008 | Ward et al. |
| 2009/0027543 A1 | 1/2009 | Kanehiro et al. |
| 2009/0050946 A1 | 2/2009 | Duparre et al. |
| 2009/0052743 A1 | 2/2009 | Techmer |
| 2009/0060281 A1 | 3/2009 | Tanida et al. |
| 2009/0086074 A1 | 4/2009 | Li et al. |
| 2009/0091645 A1 | 4/2009 | Trimeche et al. |
| 2009/0091806 A1 | 4/2009 | Inuiya |
| 2009/0096050 A1 | 4/2009 | Park |
| 2009/0102956 A1 | 4/2009 | Georgiev |
| 2009/0109306 A1 | 4/2009 | Shan et al. |
| 2009/0127430 A1 | 5/2009 | Hirasawa et al. |
| 2009/0128644 A1 | 5/2009 | Camp, Jr. et al. |
| 2009/0128833 A1 | 5/2009 | Yahav |
| 2009/0129667 A1 | 5/2009 | Ho |
| 2009/0140131 A1 | 6/2009 | Utagawa et al. |
| 2009/0141933 A1 | 6/2009 | Wagg |
| 2009/0147919 A1 | 6/2009 | Goto et al. |
| 2009/0152664 A1* | 6/2009 | Klem ............... H01L 27/14603 257/440 |
| 2009/0167922 A1 | 7/2009 | Perlman et al. |
| 2009/0167934 A1 | 7/2009 | Gupta |
| 2009/0179142 A1 | 7/2009 | Duparre et al. |
| 2009/0180021 A1 | 7/2009 | Kikuchi et al. |
| 2009/0200622 A1 | 8/2009 | Tai et al. |
| 2009/0201371 A1 | 8/2009 | Matsuda et al. |
| 2009/0207235 A1 | 8/2009 | Francini et al. |
| 2009/0219435 A1 | 9/2009 | Yuan et al. |
| 2009/0225203 A1 | 9/2009 | Tanida et al. |
| 2009/0237520 A1 | 9/2009 | Kaneko et al. |
| 2009/0245573 A1 | 10/2009 | Saptharishi et al. |
| 2009/0256947 A1 | 10/2009 | Ciurea et al. |
| 2009/0263017 A1 | 10/2009 | Tanbakuchi |
| 2009/0268192 A1 | 10/2009 | Koenck et al. |
| 2009/0268970 A1 | 10/2009 | Babacan et al. |
| 2009/0268983 A1 | 10/2009 | Stone |
| 2009/0274387 A1 | 11/2009 | Jin |
| 2009/0284651 A1 | 11/2009 | Srinivasan |
| 2009/0290811 A1 | 11/2009 | Imai |
| 2009/0297056 A1 | 12/2009 | Lelescu et al. |
| 2009/0302205 A9 | 12/2009 | Olsen et al. |
| 2009/0317061 A1 | 12/2009 | Jung et al. |
| 2009/0322876 A1 | 12/2009 | Lee et al. |
| 2009/0323195 A1 | 12/2009 | Hembree et al. |
| 2009/0323206 A1 | 12/2009 | Oliver et al. |
| 2009/0324118 A1 | 12/2009 | Maslov et al. |
| 2010/0002126 A1 | 1/2010 | Wenstrand |
| 2010/0002313 A1 | 1/2010 | Duparre et al. |
| 2010/0002314 A1 | 1/2010 | Duparre |
| 2010/0007714 A1 | 1/2010 | Kim et al. |
| 2010/0013927 A1 | 1/2010 | Nixon |
| 2010/0044815 A1 | 2/2010 | Chang et al. |
| 2010/0053342 A1 | 3/2010 | Hwang |
| 2010/0053600 A1 | 3/2010 | Tanida et al. |
| 2010/0060746 A9 | 3/2010 | Olsen et al. |
| 2010/0073463 A1 | 3/2010 | Momonoi et al. |
| 2010/0074532 A1 | 3/2010 | Gordon et al. |
| 2010/0085425 A1 | 4/2010 | Tan |
| 2010/0086227 A1 | 4/2010 | Sun et al. |
| 2010/0091389 A1 | 4/2010 | Henriksen et al. |
| 2010/0097491 A1 | 4/2010 | Farina et al. |
| 2010/0103175 A1 | 4/2010 | Okutomi et al. |
| 2010/0103259 A1 | 4/2010 | Tanida et al. |
| 2010/0103308 A1 | 4/2010 | Butterfield et al. |
| 2010/0111444 A1 | 5/2010 | Coffman |
| 2010/0118127 A1 | 5/2010 | Nam |
| 2010/0128145 A1 | 5/2010 | Pitts et al. |
| 2010/0133230 A1 | 6/2010 | Henriksen et al. |
| 2010/0133418 A1* | 6/2010 | Sargent ............... B82Y 10/00 250/208.1 |
| 2010/0141802 A1 | 6/2010 | Knight et al. |
| 2010/0142828 A1 | 6/2010 | Chang et al. |
| 2010/0142839 A1 | 6/2010 | Lakus-Becker |
| 2010/0157073 A1 | 6/2010 | Kondo et al. |
| 2010/0166410 A1 | 6/2010 | Chang et al. |
| 2010/0165152 A1 | 7/2010 | Lim |
| 2010/0171866 A1 | 7/2010 | Brady et al. |
| 2010/0177411 A1 | 7/2010 | Hegde et al. |
| 2010/0182406 A1 | 7/2010 | Benitez et al. |
| 2010/0194860 A1 | 8/2010 | Mentz et al. |
| 2010/0194901 A1 | 8/2010 | van Hoorebeke et al. |
| 2010/0195716 A1 | 8/2010 | Klein et al. |
| 2010/0201834 A1 | 8/2010 | Maruyama et al. |
| 2010/0202054 A1 | 8/2010 | Niederer |
| 2010/0202683 A1 | 8/2010 | Robinson |
| 2010/0208100 A9 | 8/2010 | Olsen et al. |
| 2010/0220212 A1 | 9/2010 | Perlman et al. |
| 2010/0223237 A1 | 9/2010 | Mishra et al. |
| 2010/0225740 A1 | 9/2010 | Jung et al. |
| 2010/0231285 A1 | 9/2010 | Boomer et al. |
| 2010/0238327 A1 | 9/2010 | Griffith et al. |
| 2010/0244165 A1 | 9/2010 | Lake et al. |
| 2010/0245684 A1 | 9/2010 | Xiao et al. |
| 2010/0254627 A1 | 10/2010 | Panahpour et al. |
| 2010/0259610 A1 | 10/2010 | Petersen et al. |
| 2010/0265346 A1 | 10/2010 | Iizuka |
| 2010/0265381 A1 | 10/2010 | Yamamoto et al. |

(56) References Cited

U.S. PATENT DOCUMENTS

| | | |
|---|---|---|
| 2010/0265385 A1 | 10/2010 | Knight |
| 2010/0281070 A1 | 11/2010 | Chan et al. |
| 2010/0289941 A1 | 11/2010 | Ito et al. |
| 2010/0290483 A1 | 11/2010 | Park et al. |
| 2010/0302423 A1 | 12/2010 | Adams, Jr. et al. |
| 2010/0309292 A1 | 12/2010 | Ho et al. |
| 2010/0309368 A1 | 12/2010 | Choi et al. |
| 2010/0321595 A1 | 12/2010 | Chiu et al. |
| 2010/0321640 A1 | 12/2010 | Yeh et al. |
| 2010/0329556 A1 | 12/2010 | Mitarai et al. |
| 2011/0001037 A1 | 1/2011 | Tewinkle |
| 2011/0018973 A1 | 1/2011 | Takayama |
| 2011/0019048 A1 | 1/2011 | Raynor et al. |
| 2011/0019243 A1 | 1/2011 | Constant, Jr. et al. |
| 2011/0031381 A1 | 2/2011 | Tay et al. |
| 2011/0032370 A1 | 2/2011 | Ludwig |
| 2011/0033129 A1 | 2/2011 | Robinson |
| 2011/0038536 A1 | 2/2011 | Gong |
| 2011/0043661 A1 | 2/2011 | Podoleanu |
| 2011/0043665 A1 | 2/2011 | Ogasahara |
| 2011/0043668 A1 | 2/2011 | McKinnon et al. |
| 2011/0044502 A1 | 2/2011 | Liu et al. |
| 2011/0051255 A1 | 3/2011 | Lee et al. |
| 2011/0055729 A1 | 3/2011 | Mason et al. |
| 2011/0064327 A1 | 3/2011 | Dagher et al. |
| 2011/0069189 A1 | 3/2011 | Venkataraman et al. |
| 2011/0080487 A1* | 4/2011 | Venkataraman ..... H04N 5/2253 348/218.1 |
| 2011/0085028 A1 | 4/2011 | Samadani et al. |
| 2011/0090217 A1 | 4/2011 | Mashitani et al. |
| 2011/0108708 A1 | 5/2011 | Olsen et al. |
| 2011/0115886 A1 | 5/2011 | Nguyen et al. |
| 2011/0121421 A1 | 5/2011 | Charbon et al. |
| 2011/0122308 A1 | 5/2011 | Duparre |
| 2011/0128393 A1 | 6/2011 | Tavi et al. |
| 2011/0128412 A1 | 6/2011 | Milnes et al. |
| 2011/0129165 A1 | 6/2011 | Lim et al. |
| 2011/0141309 A1 | 6/2011 | Nagashima et al. |
| 2011/0142138 A1 | 6/2011 | Tian et al. |
| 2011/0149408 A1 | 6/2011 | Hahgholt et al. |
| 2011/0149409 A1 | 6/2011 | Haugholt et al. |
| 2011/0153248 A1 | 6/2011 | Gu et al. |
| 2011/0157321 A1 | 6/2011 | Nakajima et al. |
| 2011/0157451 A1 | 6/2011 | Chang |
| 2011/0169994 A1 | 7/2011 | DiFrancesco et al. |
| 2011/0176020 A1 | 7/2011 | Chang |
| 2011/0181797 A1 | 7/2011 | Galstian et al. |
| 2011/0193944 A1 | 8/2011 | Lian et al. |
| 2011/0200319 A1 | 8/2011 | Kravitz et al. |
| 2011/0206291 A1 | 8/2011 | Kashani |
| 2011/0207074 A1 | 8/2011 | Hall-Holt et al. |
| 2011/0211077 A1 | 9/2011 | Nayar |
| 2011/0211824 A1 | 9/2011 | Georgiev et al. |
| 2011/0221599 A1 | 9/2011 | Högasten |
| 2011/0221658 A1 | 9/2011 | Haddick et al. |
| 2011/0221939 A1 | 9/2011 | Jerdev |
| 2011/0221950 A1 | 9/2011 | Oostra |
| 2011/0222757 A1 | 9/2011 | Yeatman, Jr. et al. |
| 2011/0228142 A1 | 9/2011 | Brueckner |
| 2011/0228144 A1 | 9/2011 | Tian et al. |
| 2011/0234841 A1 | 9/2011 | Akeley et al. |
| 2011/0241234 A1 | 10/2011 | Duparre |
| 2011/0242342 A1 | 10/2011 | Goma et al. |
| 2011/0242355 A1 | 10/2011 | Goma et al. |
| 2011/0242356 A1 | 10/2011 | Aleksic et al. |
| 2011/0243428 A1 | 10/2011 | Das Gupta et al. |
| 2011/0255592 A1 | 10/2011 | Sung et al. |
| 2011/0255745 A1 | 10/2011 | Hodder et al. |
| 2011/0261993 A1 | 10/2011 | Weiming et al. |
| 2011/0267264 A1 | 11/2011 | McCarthy et al. |
| 2011/0267348 A1 | 11/2011 | Lin et al. |
| 2011/0273531 A1 | 11/2011 | Ito et al. |
| 2011/0274366 A1 | 11/2011 | Tardif |
| 2011/0279705 A1 | 11/2011 | Kuang et al. |
| 2011/0279721 A1 | 11/2011 | Mcmahon |
| 2011/0285701 A1 | 11/2011 | Chen et al. |
| 2011/0285866 A1 | 11/2011 | Bhrugumalla et al. |
| 2011/0285910 A1 | 11/2011 | Bamji et al. |
| 2011/0292216 A1 | 12/2011 | Fergus et al. |
| 2011/0298917 A1 | 12/2011 | Yanagita |
| 2011/0300929 A1 | 12/2011 | Tardif et al. |
| 2011/0310980 A1 | 12/2011 | Mathew |
| 2011/0316968 A1 | 12/2011 | Taguchi et al. |
| 2011/0317766 A1 | 12/2011 | Lim, II et al. |
| 2012/0012748 A1* | 1/2012 | Pain ..... H04N 5/345 250/332 |
| 2012/0014456 A1 | 1/2012 | Martinez et al. |
| 2012/0019530 A1 | 1/2012 | Baker |
| 2012/0019700 A1 | 1/2012 | Gaber |
| 2012/0023456 A1 | 1/2012 | Sun et al. |
| 2012/0026297 A1 | 2/2012 | Sato |
| 2012/0026342 A1 | 2/2012 | Yu et al. |
| 2012/0026366 A1 | 2/2012 | Golan et al. |
| 2012/0026451 A1 | 2/2012 | Nystrom |
| 2012/0039525 A1 | 2/2012 | Tian et al. |
| 2012/0044249 A1 | 2/2012 | Mashitani et al. |
| 2012/0044372 A1 | 2/2012 | Côté et al. |
| 2012/0051624 A1 | 3/2012 | Ando et al. |
| 2012/0056982 A1 | 3/2012 | Katz et al. |
| 2012/0057040 A1 | 3/2012 | Park et al. |
| 2012/0062702 A1 | 3/2012 | Jiang et al. |
| 2012/0062756 A1 | 3/2012 | Tian |
| 2012/0069235 A1 | 3/2012 | Imai |
| 2012/0081519 A1 | 4/2012 | Goma |
| 2012/0086803 A1 | 4/2012 | Malzbender et al. |
| 2012/0105691 A1 | 5/2012 | Waqas et al. |
| 2012/0113232 A1 | 5/2012 | Joblove |
| 2012/0113318 A1 | 5/2012 | Galstian et al. |
| 2012/0113413 A1 | 5/2012 | Miahczylowicz-Wolski et al. |
| 2012/0127275 A1 | 5/2012 | Von Zitzewitz et al. |
| 2012/0147139 A1 | 6/2012 | Li et al. |
| 2012/0147205 A1 | 6/2012 | Lelescu et al. |
| 2012/0153153 A1 | 6/2012 | Chang et al. |
| 2012/0154551 A1 | 6/2012 | Inoue |
| 2012/0155830 A1 | 6/2012 | Sasaki et al. |
| 2012/0163672 A1 | 6/2012 | McKinnon |
| 2012/0169433 A1 | 7/2012 | Mullins |
| 2012/0170134 A1 | 7/2012 | Bolis et al. |
| 2012/0176479 A1 | 7/2012 | Mayhew et al. |
| 2012/0176481 A1 | 7/2012 | Lukk et al. |
| 2012/0188235 A1 | 7/2012 | Wu et al. |
| 2012/0188341 A1 | 7/2012 | Klein Gunnewiek et al. |
| 2012/0188389 A1 | 7/2012 | Lin et al. |
| 2012/0188420 A1 | 7/2012 | Black et al. |
| 2012/0188634 A1 | 7/2012 | Kubala et al. |
| 2012/0198677 A1 | 8/2012 | Duparre |
| 2012/0200669 A1 | 8/2012 | Lai |
| 2012/0200726 A1 | 8/2012 | Bugnariu |
| 2012/0200734 A1 | 8/2012 | Tang |
| 2012/0206582 A1 | 8/2012 | DiCarlo et al. |
| 2012/0219236 A1 | 8/2012 | Ali et al. |
| 2012/0224083 A1 | 9/2012 | Jovanovski et al. |
| 2012/0229602 A1 | 9/2012 | Chen et al. |
| 2012/0229628 A1 | 9/2012 | Ishiyama et al. |
| 2012/0237114 A1 | 9/2012 | Park et al. |
| 2012/0249550 A1 | 10/2012 | Akeley et al. |
| 2012/0249750 A1 | 10/2012 | Izzat et al. |
| 2012/0249836 A1 | 10/2012 | Ali et al. |
| 2012/0249853 A1 | 10/2012 | Krolczyk et al. |
| 2012/0262601 A1 | 10/2012 | Choi et al. |
| 2012/0262607 A1 | 10/2012 | Shimura et al. |
| 2012/0268574 A1 | 10/2012 | Gidon et al. |
| 2012/0274626 A1 | 11/2012 | Hsieh et al. |
| 2012/0287291 A1 | 11/2012 | Mcmahon et al. |
| 2012/0290257 A1 | 11/2012 | Hodge et al. |
| 2012/0293489 A1 | 11/2012 | Chen et al. |
| 2012/0293624 A1 | 11/2012 | Chen et al. |
| 2012/0293695 A1 | 11/2012 | Tanaka |
| 2012/0307093 A1 | 12/2012 | Miyoshi |
| 2012/0307099 A1 | 12/2012 | Yahata et al. |
| 2012/0314033 A1 | 12/2012 | Lee et al. |
| 2012/0314937 A1 | 12/2012 | Kim et al. |
| 2012/0327222 A1 | 12/2012 | Ng et al. |
| 2013/0002828 A1 | 1/2013 | Ding et al. |

(56) References Cited

U.S. PATENT DOCUMENTS

| | | |
|---|---|---|
| 2013/0003184 A1 | 1/2013 | Duparre |
| 2013/0010073 A1 | 1/2013 | Do |
| 2013/0016885 A1 | 1/2013 | Tsujimoto et al. |
| 2013/0022111 A1 | 1/2013 | Chen et al. |
| 2013/0027580 A1 | 1/2013 | Olsen et al. |
| 2013/0033579 A1 | 2/2013 | Wajs |
| 2013/0033585 A1 | 2/2013 | Li et al. |
| 2013/0038696 A1 | 2/2013 | Ding et al. |
| 2013/0050504 A1 | 2/2013 | Safaee-Rad et al. |
| 2013/0050526 A1 | 2/2013 | Keelan |
| 2013/0057710 A1 | 3/2013 | Mcmahon |
| 2013/0070060 A1 | 3/2013 | Chatterjee |
| 2013/0076967 A1 | 3/2013 | Brunner et al. |
| 2013/0077859 A1 | 3/2013 | Stauder et al. |
| 2013/0077880 A1 | 3/2013 | Venkataraman et al. |
| 2013/0077882 A1 | 3/2013 | Venkataraman et al. |
| 2013/0083172 A1 | 4/2013 | Baba |
| 2013/0088489 A1 | 4/2013 | Schmeitz et al. |
| 2013/0088637 A1 | 4/2013 | Duparre |
| 2013/0093842 A1 | 4/2013 | Yahata |
| 2013/0107061 A1 | 5/2013 | Kumar et al. |
| 2013/0113899 A1 | 5/2013 | Morohoshi et al. |
| 2013/0113939 A1 | 5/2013 | Strandemar |
| 2013/0120605 A1 | 5/2013 | Georgiev et al. |
| 2013/0121559 A1 | 5/2013 | Hu |
| 2013/0128068 A1 | 5/2013 | Georgiev et al. |
| 2013/0128069 A1 | 5/2013 | Georgiev et al. |
| 2013/0128087 A1 | 5/2013 | Georgiev et al. |
| 2013/0128121 A1 | 5/2013 | Agarwala et al. |
| 2013/0147979 A1 | 6/2013 | McMahon et al. |
| 2013/0176394 A1 | 7/2013 | Tian et al. |
| 2013/0208138 A1 | 8/2013 | Li |
| 2013/0215108 A1 | 8/2013 | McMahon et al. |
| 2013/0215231 A1 | 8/2013 | Hiramoto et al. |
| 2013/0222556 A1 | 8/2013 | Shimada |
| 2013/0223759 A1 | 8/2013 | Nishiyama et al. |
| 2013/0229540 A1 | 9/2013 | Farina et al. |
| 2013/0230237 A1 | 9/2013 | Schlosser et al. |
| 2013/0250123 A1 | 9/2013 | Zhang et al. |
| 2013/0250150 A1 | 9/2013 | Malone |
| 2013/0258067 A1 | 10/2013 | Zhang et al. |
| 2013/0259317 A1 | 10/2013 | Gaddy |
| 2013/0265459 A1 | 10/2013 | Duparre et al. |
| 2013/0274596 A1 | 10/2013 | Azizian et al. |
| 2013/0274923 A1 | 10/2013 | By et al. |
| 2013/0293760 A1 | 11/2013 | Nisenzon et al. |
| 2014/0002674 A1 | 1/2014 | Duparre et al. |
| 2014/0009586 A1 | 1/2014 | McNamer et al. |
| 2014/0013273 A1 | 1/2014 | Ng et al. |
| 2014/0037137 A1 | 2/2014 | Broaddus et al. |
| 2014/0037140 A1 | 2/2014 | Benhimane et al. |
| 2014/0043507 A1 | 2/2014 | Wang et al. |
| 2014/0076336 A1 | 3/2014 | Clayton et al. |
| 2014/0078333 A1 | 3/2014 | Miao |
| 2014/0079336 A1 | 3/2014 | Venkataraman et al. |
| 2014/0085502 A1 | 3/2014 | Lin et al. |
| 2014/0092281 A1 | 4/2014 | Nisenzon et al. |
| 2014/0098267 A1 | 4/2014 | Tian et al. |
| 2014/0104490 A1 | 4/2014 | Hsieh et al. |
| 2014/0118493 A1 | 5/2014 | Sali et al. |
| 2014/0118584 A1 | 5/2014 | Lee et al. |
| 2014/0132810 A1 | 5/2014 | McMahon |
| 2014/0146132 A1 | 5/2014 | Bagnato et al. |
| 2014/0146201 A1 | 5/2014 | Knight et al. |
| 2014/0176592 A1 | 6/2014 | Wilburn et al. |
| 2014/0183334 A1 | 7/2014 | Wang et al. |
| 2014/0186045 A1 | 7/2014 | Poddar et al. |
| 2014/0192154 A1 | 7/2014 | Jeong et al. |
| 2014/0192253 A1 | 7/2014 | Laroia |
| 2014/0198188 A1 | 7/2014 | Izawa |
| 2014/0204183 A1 | 7/2014 | Lee et al. |
| 2014/0218546 A1 | 8/2014 | Mcmahon |
| 2014/0232822 A1 | 8/2014 | Venkataraman et al. |
| 2014/0240528 A1 | 8/2014 | Venkataraman et al. |
| 2014/0240529 A1 | 8/2014 | Venkataraman et al. |
| 2014/0253738 A1 | 9/2014 | Mullis |
| 2014/0267243 A1 | 9/2014 | Venkataraman et al. |
| 2014/0267286 A1 | 9/2014 | Duparre |
| 2014/0267633 A1 | 9/2014 | Venkataraman et al. |
| 2014/0267762 A1 | 9/2014 | Mullis et al. |
| 2014/0267890 A1 | 9/2014 | Lelescu et al. |
| 2014/0285675 A1 | 9/2014 | Mullis |
| 2014/0313315 A1 | 10/2014 | Shoham et al. |
| 2014/0321712 A1 | 10/2014 | Ciurea et al. |
| 2014/0333731 A1 | 11/2014 | Venkataraman et al. |
| 2014/0333764 A1 | 11/2014 | Venkataraman et al. |
| 2014/0333787 A1 | 11/2014 | Venkataraman et al. |
| 2014/0340539 A1 | 11/2014 | Venkataraman et al. |
| 2014/0347509 A1 | 11/2014 | Venkataraman et al. |
| 2014/0347748 A1 | 11/2014 | Duparre |
| 2014/0354773 A1 | 12/2014 | Venkataraman et al. |
| 2014/0354843 A1 | 12/2014 | Venkataraman et al. |
| 2014/0354844 A1 | 12/2014 | Venkataraman et al. |
| 2014/0354853 A1 | 12/2014 | Venkataraman et al. |
| 2014/0354854 A1 | 12/2014 | Venkataraman et al. |
| 2014/0354855 A1 | 12/2014 | Venkataraman et al. |
| 2014/0355870 A1 | 12/2014 | Venkataraman et al. |
| 2014/0368662 A1 | 12/2014 | Venkataraman et al. |
| 2014/0368683 A1 | 12/2014 | Venkataraman et al. |
| 2014/0368684 A1 | 12/2014 | Venkataraman et al. |
| 2014/0368685 A1 | 12/2014 | Venkataraman et al. |
| 2014/0368686 A1 | 12/2014 | Duparre |
| 2014/0369612 A1 | 12/2014 | Venkataraman et al. |
| 2014/0369615 A1 | 12/2014 | Venkataraman et al. |
| 2014/0376825 A1 | 12/2014 | Venkataraman et al. |
| 2014/0376826 A1 | 12/2014 | Venkataraman et al. |
| 2015/0002734 A1 | 1/2015 | Lee |
| 2015/0003752 A1 | 1/2015 | Venkataraman et al. |
| 2015/0003753 A1 | 1/2015 | Venkataraman et al. |
| 2015/0009353 A1 | 1/2015 | Venkataraman et al. |
| 2015/0009354 A1 | 1/2015 | Venkataraman et al. |
| 2015/0009362 A1 | 1/2015 | Venkataraman et al. |
| 2015/0015669 A1 | 1/2015 | Venkataraman et al. |
| 2015/0035992 A1 | 2/2015 | Mullis |
| 2015/0036014 A1 | 2/2015 | Lelescu et al. |
| 2015/0036015 A1 | 2/2015 | Lelescu et al. |
| 2015/0042766 A1 | 2/2015 | Ciurea et al. |
| 2015/0042767 A1 | 2/2015 | Ciurea et al. |
| 2015/0042833 A1 | 2/2015 | Lelescu et al. |
| 2015/0049915 A1 | 2/2015 | Ciurea et al. |
| 2015/0049916 A1 | 2/2015 | Ciurea et al. |
| 2015/0049917 A1 | 2/2015 | Ciurea et al. |
| 2015/0055884 A1 | 2/2015 | Venkataraman et al. |
| 2015/0085174 A1 | 3/2015 | Shabtay et al. |
| 2015/0091900 A1 | 4/2015 | Yang et al. |
| 2015/0098079 A1 | 4/2015 | Montgomery et al. |
| 2015/0104101 A1 | 4/2015 | Bryant et al. |
| 2015/0122411 A1 | 5/2015 | Rodda et al. |
| 2015/0124113 A1 | 5/2015 | Rodda et al. |
| 2015/0124151 A1 | 5/2015 | Rodda et al. |
| 2015/0146029 A1 | 5/2015 | Venkataraman et al. |
| 2015/0146030 A1 | 5/2015 | Venkataraman et al. |
| 2015/0199841 A1 | 7/2015 | Venkataraman et al. |
| 2015/0243480 A1 | 8/2015 | Yamada et al. |
| 2015/0248744 A1 | 9/2015 | Hayasaka et al. |
| 2015/0296137 A1 | 10/2015 | Duparre et al. |
| 2015/0312455 A1 | 10/2015 | Venkataraman et al. |
| 2015/0326852 A1 | 11/2015 | Duparre et al. |
| 2015/0373261 A1 | 12/2015 | Rodda et al. |
| 2016/0044252 A1 | 2/2016 | Molina |
| 2016/0044257 A1 | 2/2016 | Venkataraman et al. |
| 2016/0057332 A1 | 2/2016 | Ciurea et al. |
| 2016/0163051 A1 | 6/2016 | Mullis |
| 2016/0165106 A1 | 6/2016 | Duparre |
| 2016/0165134 A1 | 6/2016 | Lelescu et al. |
| 2016/0165147 A1 | 6/2016 | Nisenzon et al. |
| 2016/0165212 A1 | 6/2016 | Mullis |
| 2016/0195733 A1 | 7/2016 | Lelescu et al. |
| 2016/0227195 A1 | 8/2016 | Venkataraman et al. |
| 2016/0249001 A1 | 8/2016 | McMahon |
| 2016/0255333 A1 | 9/2016 | Nisenzon et al. |
| 2016/0266284 A1 | 9/2016 | Duparre et al. |
| 2016/0267665 A1 | 9/2016 | Venkataraman et al. |
| 2016/0267672 A1 | 9/2016 | Ciurea et al. |

(56) References Cited

U.S. PATENT DOCUMENTS

| | | | |
|---|---|---|---|
| 2016/0269626 A1 | 9/2016 | McMahon | |
| 2016/0269627 A1 | 9/2016 | McMahon | |
| 2016/0269650 A1 | 9/2016 | Venkataraman et al. | |
| 2016/0269651 A1 | 9/2016 | Venkataraman et al. | |
| 2016/0269664 A1 | 9/2016 | Duparre | |
| 2016/0316140 A1 | 10/2016 | Nayar et al. | |
| 2017/0006233 A1 | 1/2017 | Venkataraman et al. | |
| 2017/0048468 A1 | 2/2017 | Pain et al. | |
| 2017/0053382 A1 | 2/2017 | Lelescu et al. | |
| 2017/0054901 A1 | 2/2017 | Venkataraman et al. | |
| 2017/0070672 A1 | 3/2017 | Rodda et al. | |
| 2017/0085845 A1 | 3/2017 | Venkataraman et al. | |
| 2017/0094243 A1 | 3/2017 | Venkataraman et al. | |
| 2017/0099465 A1 | 4/2017 | Mullis et al. | |
| 2017/0163862 A1 | 6/2017 | Molina | |
| 2017/0178363 A1 | 6/2017 | Venkataraman et al. | |
| 2017/0187933 A1 | 6/2017 | Duparre | |

FOREIGN PATENT DOCUMENTS

| | | |
|---|---|---|
| CN | 101010619 A | 8/2007 |
| CN | 101064780 A | 10/2007 |
| CN | 101102388 A | 1/2008 |
| CN | 101147392 A | 3/2008 |
| CN | 101427372 A | 5/2009 |
| CN | 101606086 A | 12/2009 |
| CN | 101883291 A | 11/2010 |
| CN | 102037717 A | 4/2011 |
| CN | 102375199 A | 3/2012 |
| EP | 0677821 A2 | 10/1995 |
| EP | 840502 A2 | 5/1998 |
| EP | 1201407 A2 | 5/2002 |
| EP | 1355274 A2 | 10/2003 |
| EP | 1734766 A2 | 12/2006 |
| EP | 2026563 A1 | 2/2009 |
| EP | 2104334 A1 | 9/2009 |
| EP | 2244484 A1 | 10/2010 |
| EP | 2336816 A2 | 6/2011 |
| EP | 2381418 A1 | 10/2011 |
| GB | 2482022 A | 1/2012 |
| JP | 59025483 | 9/1984 |
| JP | 64037177 | 7/1989 |
| JP | 02285772 A | 11/1990 |
| JP | 07-15457 A | 1/1995 |
| JP | 09181913 A | 7/1997 |
| JP | 11142609 A | 5/1999 |
| JP | 11223708 A | 8/1999 |
| JP | 2000209503 A | 7/2000 |
| JP | 2001008235 A2 | 1/2001 |
| JP | 2001194114 A2 | 7/2001 |
| JP | 2001264033 A2 | 9/2001 |
| JP | 2001277260 A | 10/2001 |
| JP | 2001337263 A2 | 12/2001 |
| JP | 2002195910 A | 7/2002 |
| JP | 2002205310 A | 7/2002 |
| JP | 2002252338 A | 9/2002 |
| JP | 2003094445 A | 4/2003 |
| JP | 2003139910 A | 5/2003 |
| JP | 2003163938 A | 6/2003 |
| JP | 2003298920 A | 10/2003 |
| JP | 2004221585 A | 8/2004 |
| JP | 2005116022 A | 4/2005 |
| JP | 2005181460 A | 7/2005 |
| JP | 2005295381 A | 10/2005 |
| JP | 2005303694 A | 10/2005 |
| JP | 2005354124 A | 12/2005 |
| JP | 2006033228 A | 2/2006 |
| JP | 2006033493 A | 2/2006 |
| JP | 2006047944 A | 2/2006 |
| JP | 2006258930 A | 9/2006 |
| JP | 2007520107 A | 7/2007 |
| JP | 2007259136 A | 10/2007 |
| JP | 2008039852 A | 2/2008 |
| JP | 2008055908 A | 3/2008 |
| JP | 2008507874 A | 3/2008 |
| JP | 2008258885 A | 10/2008 |
| JP | 2009132010 A | 6/2009 |
| JP | 2009300268 A | 12/2009 |
| JP | 2011017764 A | 1/2011 |
| JP | 2011030184 A | 2/2011 |
| JP | 2011109484 A | 6/2011 |
| JP | 2011523538 A | 8/2011 |
| JP | 2013526801 A | 6/2013 |
| JP | 2014521117 A | 8/2014 |
| KR | 1020110097647 A | 8/2011 |
| TW | 200828994 A | 7/2008 |
| TW | 200939739 A | 9/2009 |
| WO | 2005057922 A1 | 6/2005 |
| WO | 2006039906 A3 | 9/2006 |
| WO | 2007013250 A1 | 2/2007 |
| WO | 2007083579 A1 | 7/2007 |
| WO | 2007134137 A2 | 11/2007 |
| WO | 2008045198 A2 | 4/2008 |
| WO | 2008050904 A1 | 5/2008 |
| WO | 2008108271 A1 | 9/2008 |
| WO | 2008108926 A1 | 9/2008 |
| WO | 2008150817 A1 | 12/2008 |
| WO | 2009073950 A1 | 6/2009 |
| WO | 2009151903 A2 | 12/2009 |
| WO | 2009157273 A1 | 12/2009 |
| WO | 2011008443 A2 | 1/2011 |
| WO | 2011055655 A1 | 5/2011 |
| WO | 2011063347 A2 | 5/2011 |
| WO | 2011105814 A2 | 9/2011 |
| WO | 2011116203 A1 | 9/2011 |
| WO | 2011063347 A3 | 10/2011 |
| WO | 2011143501 A1 | 11/2011 |
| WO | 2012057619 A1 | 5/2012 |
| WO | 2012057620 A2 | 5/2012 |
| WO | 2012057621 A1 | 5/2012 |
| WO | 2012057622 A1 | 5/2012 |
| WO | 2012057623 A1 | 5/2012 |
| WO | 2012057620 A3 | 6/2012 |
| WO | 2012074361 A1 | 6/2012 |
| WO | 2012078126 A1 | 6/2012 |
| WO | 2012082904 A1 | 6/2012 |
| WO | 2012155119 A1 | 11/2012 |
| WO | 2013003276 A1 | 1/2013 |
| WO | 2013043751 A1 | 3/2013 |
| WO | 2013043761 A1 | 3/2013 |
| WO | 2013049699 A1 | 4/2013 |
| WO | 2013055960 A1 | 4/2013 |
| WO | 2013119706 A1 | 8/2013 |
| WO | 2013126578 A1 | 8/2013 |
| WO | 2014052974 A2 | 4/2014 |
| WO | 2014032020 A3 | 5/2014 |
| WO | 2014078443 A1 | 5/2014 |
| WO | 2014130849 A1 | 8/2014 |
| WO | 2014133974 A1 | 9/2014 |
| WO | 2014138695 A1 | 9/2014 |
| WO | 2014138697 A1 | 9/2014 |
| WO | 2014144157 A1 | 9/2014 |
| WO | 2014145856 A1 | 9/2014 |
| WO | 2014149403 A1 | 9/2014 |
| WO | 2014149902 A1 | 9/2014 |
| WO | 2014150856 A1 | 9/2014 |
| WO | 2014159721 A1 | 10/2014 |
| WO | 2014159779 A1 | 10/2014 |
| WO | 2014160142 A1 | 10/2014 |
| WO | 2014164550 A2 | 10/2014 |
| WO | 2014164909 A1 | 10/2014 |
| WO | 2014165244 A1 | 10/2014 |
| WO | 2014133974 A9 | 4/2015 |
| WO | 2015048694 A2 | 4/2015 |
| WO | 2015070105 A1 | 5/2015 |
| WO | 2015074078 A1 | 5/2015 |
| WO | 2015081279 A1 | 6/2015 |

OTHER PUBLICATIONS

US 8,964,053, 02/2015, Venkataraman et al. (withdrawn)
US 8,965,058, 02/2015, Venkataraman et al. (withdrawn)
US 9,014,491, 04/2015, Venkataraman et al. (withdrawn)

(56) References Cited

OTHER PUBLICATIONS

US 9,338,332, 06/2016, Venkataraman et al. (withdrawn)
Extended European Search Report for European Application EP12782935.6, report completed Aug. 28, 2014 dated Sep. 4, 2014, 6 Pgs.
Extended European Search Report for European Application EP12804266.0, Report Completed Jan. 27, 2015, dated Feb. 3, 2015, 6 Pgs.
Extended European Search Report for European Application EP12835041.0, Report Completed Jan. 28, 2015, dated Feb. 4, 2015, 6 Pgs.
International Preliminary Report on Patentability for International Application No. PCT/US2012/059813, International Filing Date Oct. 11, 2012, Search Completed Apr. 15, 2014, 7 pgs.
International Preliminary Report on Patentability for International Application No. PCT/US2013/059991, Report dated Mar. 17, 2015, dated Mar. 26, 2015, 8 pgs.
International Preliminary Report on Patentability for International Application PCT/US2013/056065, Report dated Feb. 24, 2015, dated Mar. 5, 2015, 4 Pgs.
International Preliminary Report on Patentability for International Application PCT/US2013/062720, Report dated Mar. 31, 2015, dated Apr. 9, 2015, 8 Pgs.
International Preliminary Report on Patentability for International Application PCT/US2013/024987, dated Aug. 21, 2014, 13 Pgs.
International Preliminary Report on Patentability for International Application PCT/US2013/027146, International Filing Date Feb. 21, 2013, Report Completed Apr. 2, 2013, dated Aug. 26, 2014, 11 pages.
International Preliminary Report on Patentability for International Application PCT/US2013/039155, report completed Nov. 4, 2014, dated Nov. 13, 2014, 10 Pgs.
International Preliminary Report on Patentability for International Application PCT/US2013/046002, Report dated Dec. 31, 2014, dated Jan. 8, 2015, 6 Pgs.
International Preliminary Report on Patentability for International Application PCT/US2013/048772, Report dated Dec. 31, 2014, dated Jan. 8, 2015, 8 Pgs.
International Preliminary Report on Patentability for International Application PCT/US2013/056502, Report dated Feb. 24, 2015, dated Mar. 5, 2015, 7 Pgs.
International Preliminary Report on Patentability for International Application PCT/US2013/069932, Report dated May 19, 2015, dated May 28, 2015, 12 Pgs.
International Preliminary Report on Patentability for International Application PCT/US2014/023762, Report dated Mar. 2, 2015, dated Mar. 9, 2015, 10 Pgs.
International Search Report and Written Opinion for International Application No. PCT/US2013/046002, Search completed Nov. 13, 2013, dated Nov. 29, 2013, 7 pgs.
International Search Report and Written Opinion for International Application No. PCT/US2013/056065, Search Completed Nov. 25, 2013, dated Nov. 26, 2013, 8 pgs.
International Search Report and Written Opinion for International Application No. PCT/US13/59991, Search Completed Feb. 6, 2014, dated Feb. 26, 2014, 8 pgs.
International Search Report and Written Opinion for International Application No. PCT/US2011/064921, Report Completed Feb. 25, 2011, dated Mar. 6, 2012, 17 pgs.
International Search Report and Written Opinion for International Application No. PCT/US2013/024987, Search Completed Mar. 27, 2013, dated Apr. 15, 2013, 14 pgs.
Bruckner et al., "Artificial compound eye applying hyperacuity", Optics Express, Dec. 11, 2006, vol. 14, No. 25, pp. 12076-12084.
Bruckner et al., "Driving microoptical imaging systems towards miniature camera applications", Proc. SPIE, Micro-Optics, 2010, 11 pgs.
Bruckner et al., "Thin wafer-level camera lenses inspired by insect compound eyes", Optics Express, Nov. 22, 2010, vol. 18, No. 24, pp. 24379-24394.

Capel, "Image Mosaicing and Super-resolution", Retrieved on Nov. 10, 2012. Retrieved from <http://citeseerx.ist.psu.edu/viewdoc/download?doi=1 0.1.1.226.2643&rep=rep1&type=pdf>, pp. 1-263.
Chan et al., "Extending the Depth of Field in a Compound-Eye Imaging System with Super-Resolution Reconstruction", Proceedings—International Conference on Pattern Recognition, 2006, vol. 3, pp. 623-626.
Chan et al., "Investigation of Computational Compound-Eye Imaging System with Super-Resolution Reconstruction", IEEE, ISASSP 2006, pp. 1177-1180.
Chan et al., "Super-resolution reconstruction in a computational compound-eye imaging system", Multidim Syst Sign Process, 2007, vol. 18, pp. 83-101.
Chen et al., "Interactive deformation of light fields", In Proceedings of SIGGRAPH I3D 2005, pp. 139-146.
Chen et al., "KNN Matting", IEEE Transactions on Pattern Analysis and Machine Intelligence, Sep. 2013, vol. 35, No. 9, pp. 2175-2188.
Drouin et al., "Fast Multiple-Baseline Stereo with Occlusion", Proceedings of the Fifth International Conference on 3-D Digital Imaging and Modeling, 2005, 8 pgs.
Drouin et al., "Geo-Consistency for Wide Multi-Camera Stereo", Proceedings of the 2005 IEEE Computer Society Conference on Computer Vision and Pattern Recognition, 2005, 8 pgs.
Drouin et al., "Improving Border Localization of Multi-Baseline Stereo Using Border-Cut", International Journal of Computer Vision, Jul. 2009, vol. 83, Issue 3, 8 pgs.
Duparre et al., "Artificial apposition compound eye fabricated by micro-optics technology", Applied Optics, Aug. 1, 2004, vol. 43, No. 22, pp. 4303-4310.
Duparre et al., "Artificial compound eye zoom camera", Bioinspiration & Biomimetics, 2008, vol. 3, pp. 1-6.
Duparre et al., "Artificial compound eyes—different concepts and their application to ultra flat image acquisition sensors", MOEMS and Miniaturized Systems IV, Proc. SPIE 5346, Jan. 2004, pp. 89-100.
Duparre et al., "Chirped arrays of refractive ellipsoidal microlenses for aberration correction under oblique incidence", Optics Express, Dec. 26, 2005, vol. 13, No. 26, pp. 10539-10551.
Duparre et al., "Micro-optical artificial compound eyes", Bioinspiration & Biomimetics, 2006, vol. 1, pp. R1-R16.
Duparre et al., "Microoptical artificial compound eyes—from design to experimental verification of two different concepts", Proc. of SPIE, Optical Design and Engineering II, vol. 5962, pp. 59622A-1-59622A-12.
Duparre et al., "Microoptical Artificial Compound Eyes—Two Different Concepts for Compact Imaging Systems", 11th Microoptics Conference, Oct. 30-Nov. 2, 2005, 2 pgs.
Duparre et al., "Microoptical telescope compound eye", Optics Express, Feb. 7, 2005, vol. 13, No. 3, pp. 889-903.
Duparre et al., "Micro-optically fabricated artificial apposition compound eye", Electronic Imaging—Science and Technology, Prod. SPIE 5301, Jan. 2004, pp. 25-33.
Duparre et al., "Novel Optics/Micro-Optics for Miniature Imaging Systems", Proc. of SPIE, 2006, vol. 6196, pp. 619607-1-619607-15.
Duparre et al., "Theoretical analysis of an artificial superposition compound eye for application in ultra flat digital image acquisition devices", Optical Systems Design, Proc. SPIE 5249, Sep. 2003, pp. 408-418.
Duparre et al., "Thin compound-eye camera", Applied Optics, May 20, 2005, vol. 44, No. 15, pp. 2949-2956.
Duparre et al., "Ultra-Thin Camera Based on Artificial Apposistion Compound Eyes", 10th Microoptics Conference, Sep. 1-3, 2004, 2 pgs.
Fanaswala, "Regularized Super-Resolution of Multi-View Images", Retrieved on Nov. 10, 2012, Retrieved from <http://www.site.uottawa.ca/-edubois/theses/Fanaswala_thesis.pdf>, 163 pgs.
Farrell et al., "Resolution and Light Sensitivity Tradeoff with Pixel Size", Proceedings of the SPIE Electronic Imaging 2006 Conference, 2006, vol. 6069, 8 pgs.
Farsiu et al., "Advances and Challenges in Super-Resolution", International Journal of Imaging Systems and Technology, 2004, vol. 14, pp. 47-57.

(56) References Cited

OTHER PUBLICATIONS

Farsiu et al., "Fast and Robust Multiframe Super Resolution", IEEE Transactions on Image Processing, Oct. 2004, vol. 13, No. 10, pp. 1327-1344.
Farsiu et al., "Multiframe Demosaicing and Super-Resolution of Color Images", IEEE Transactions on Image Processing, Jan. 2006, vol. 15, No. 1, pp. 141-159.
Feris et al., "Multi-Flash Stereopsis: Depth Edge Preserving Stereo with Small Baseline Illumination", IEEE Trans on PAMI, 2006, 31 pgs.
Fife et al., "A 3D Multi-Aperture Image Sensor Architecture", Custom Integrated Circuits Conference, 2006, CICC '06, IEEE, pp. 281-284.
Fife et al., "A 3MPixel Multi-Aperture Image Sensor with 0.7Mu Pixels in 0.11Mu CMOS", ISSCC 2008, Session 2, Image Sensors & Technology, 2008, pp. 48-50.
Fischer, et al., "Optical System Design", 2nd Edition, SPIE Press, pp. 191-198.
Fischer, et al., "Optical System Design", 2nd Edition, SPIE Press, pp. 49-58.
Goldman et al., "Video Object Annotation, Navigation, and Composition", In Proceedings of UIST 2008, pp. 3-12.
Gortler et al., "The Lumigraph", In Proceedings of SIGGRAPH 1996, pp. 43-54.
Hacohen et al., "Non-Rigid Dense Correspondence with Applications for Image Enhancement", ACM Transactions on Graphics, 30, 4, 2011, pp. 70:1-70:10.
Hamilton, "JPEG File Interchange Format, Version 1.02", Sep. 1, 1992, 9 pgs.
Hardie, "A Fast Image Super-Algorithm Using an Adaptive Wiener Filter", IEEE Transactions on Image Processing, Dec. 2007, vol. 16, No. 12, pp. 2953-2964.
Hasinoff et al., "Search-and-Replace Editing for Personal Photo Collections", Computational Photography (ICCP), 2010, pp. 1-8.
Horisaki et al., "Irregular Lens Arrangement Design to Improve Imaging Performance of Compound-Eye Imaging Systems", Applied Physics Express, 2010, vol. 3, pp. 022501-1-022501-3.
Horisaki et al., "Superposition Imaging for Three-Dimensionally Space-Invariant Point Spread Functions", Applied Physics Express, 2011, vol. 4, pp. 112501-1-112501-3.
Horn et al., "LightShop: Interactive Light Field Manipulation and Rendering", In Proceedings of I3D 2007, pp. 121-128.
Isaksen et al., "Dynamically Reparameterized Light Fields", In Proceedings of SIGGRAPH 2000, pp. 297-306.
Jarabo et al., "Efficient Propagation of Light Field Edits", In Proceedings of SIACG 2011, pp. 75-80.
Joshi, et al., "Synthetic Aperture Tracking: Tracking Through Occlusions", I CCV IEEE 11th International Conference on Computer Vision, Oct. 2007, Retrieved from <URL: http:I/ieeexplore.ieee.org/stamp/stamp.jsp?tp=&arnumber=4409032 &isnumber=4408819> on Jul. 28, 2014, pp. 1-8.
Kang et al.,, "Handling Occlusions inn Dense Multi-View Stereo", Computer Vision and Pattern Recognition, 2001, vol. 1, pp. I-103-I-110.
Kitamura et al., "Reconstruction of a high-resolution image on a compound-eye image-capturing system", Applied Optics, Mar. 10, 2004, vol. 43, No. 8, pp. 1719-1727.
Krishnamurthy et al., "Compression and Transmission of Depth Maps for Image-Based Rendering", Image Processing, 2001, pp. 828-831.
Kutulakos et al., "Occluding Contour Detection Using Affine Invariants and Purposive Viewpoint Control", Proc. CVPR 94, 8 pgs.
Lai et al., "A Large-Scale Hierarchical Multi-View RGB-D Object Dataset", May 2011, 8 pgs.
Lee et al., "Electroactive Polymer Actuator for Lens-Drive Unit in Auto-Focus Compact Camera Module", ETRI Journal, vol. 31, No. 6, Dec. 2009, pp. 695-702.
Lensvector, "How LensVector Autofocus Works", printed from http://www.lensvector.com/overview.html, Nov. 2, 2012, 1 pg.

Levin et al., "A Closed Form Solution to Natural Image Matting", Pattern Analysis and Machine Intelligence, Feb. 2008, vol. 30, 8 pgs.
Levoy, "Light Fields and Computational Imaging", IEEE Computer Society, Aug. 2006, pp. 46-55.
Levoy et al., "Light Field Rendering", Proc. ADM SIGGRAPH '96, pp. 1-12.
Li et al., "A Hybrid Camera for Motion Deblurring and Depth Map Super-Resolution", Jun. 23-28, 2008, IEEE Conference on Computer Vision and Pattern Recognition, 8 pgs. Retrieved from www.eecis.udel.edu/~jye/lab_research/08/deblur-feng.pdf on Feb. 5, 2014.
Liu et al., "Virtual View Reconstruction Using Temporal Information", IEEE International Conference on Multimedia and Expo, 2012, pp. 115-120.
Lo et al., "Stereoscopic 3D Copy & Paste", ACM Transactions on Graphics, vol. 29, No. 6, Article 147, Dec. 2010, pp. 147:1-147:10.
Merkle, Philipp et al., "Adaptation and optimization of coding algorithms for mobile 3DTV", Mobile3DTV Project No. 216503, Nov. 2008, 55 pgs.
Mitra et al., "Light Field Denoising, Light Field Superresolution and Stereo Camera Based Refocussing using a GMM Light Field Patch Prior", Computer Vision and Pattern Recognition Workshops (CVPRW), 2012 IEEE Computer Society Conference on Jun. 16-21, 2012, pp. 22-28.
Moreno-Noguer, Francese et al., "Active Refocusing of Images and Videos", ACM SIGGRAPH, 2007, vol. 26, pp. 1-10, Retrieved from the Internet <URL:http://doi.acm.org/1 0.1145/1276377.1276461> on Jul. 8, 2015.
Muehlebach, "Camera Auto Exposure Control for VSLAM Applications", Studies on Mechatronics, Swiss Federal Institute of Technology Zurich, Autumn Term 2010 course, 67 pgs.
Nayar, "Computational Cameras: Redefining the Image", IEEE Computer Society, Aug. 2006, pp. 30-38.
Ng, "Digital Light Field Photography", Thesis, Jul. 2006, 203 pgs.
Ng et al., "Super-Resolution Image Restoration from Blurred Low-Resolution Images", Journal of Mathematical Imaging and Vision, 2005, vol. 23, pp. 367-378.
Nitta et al., "Image reconstruction for thin observation module by bound optics by using the iterative backprojection method", Applied Optics, May 1, 2006, vol. 45, No. 13, pp. 2893-2900.
Nomura et al., "Scene Collages and Flexible Camera Arrays", Proceedings of Eurographics Symposium on Rendering, 2007, 12 pgs.
Park et al., "Super-Resolution Image Reconstruction", IEEE Signal Processing Magazine, May 2003, pp. 21-36.
Perwass et al., "Single Lens 3D-Camera with Extended Depth-of-Field", printed from www.raytrix.de, Jan. 2012, 15 pgs.
Pham et al., "Robust Super-Resolution without Regularization", Journal of Physics: Conference Series 124, 2008, pp. 1-19.
Philips 3D Solutions, "3D Interface Specifications, White Paper", Philips 3D Solutions retrieved from www.philips.com/3dsolutions, Feb. 15, 2008 29 pgs.
Polight, "Designing Imaging Products Using Reflowable Autofocus Lenses", http://www.polight.no/tunable-polymer-autofocus-lens-html--11.html.
Pouydebasquea et al., "Varifocal liquid lenses with integrated actuator, high focusing power and low operating voltage fabricated on 200 mm wafers", Sensors and Actuators A: Physical, vol. 172, Issue 1, Dec. 2011, pp. 280-286.
Protter et al., "Generalizing the Nonlocal-Means to Super-Resolution Reconstruction", IEEE Transactions on Image Processing, Jan. 2009, vol. 18, No. 1, pp. 36-51.
Radtke et al., "Laser lithographic fabrication and characterization of a spherical artificial compound eye", Optics Express, Mar. 19, 2007, vol. 15, No. 6, pp. 3067-3077.
Rajan, Deepu et al., "Simultaneous Estimation of Super Resolved Scene and Depth Map from Low Resolution Defocused Observations", IEEE Computer Society, vol. 25, No. 9; Sep. 2003; pp. 1-16.
Rander et al., "Virtualized Reality: Constructing Time-Varying Virtual Worlds From Real World Events", Proc. of IEEE Visualization '97, Phoenix, Arizona, Oct. 19-24, 1997, pp. 277-283, 552.

(56) References Cited

OTHER PUBLICATIONS

Rhemann et al., "Fast Cost-Volume Filtering for Visual Correspondence and Beyond", IEEE Trans. Pattern Anal. Mach. Intell, 2013, vol. 35, No. 2, pp. 504-511.
Robertson et al., "Dynamic Range Improvement Through Multiple Exposures", In Proc. of the Int. Conf. on Image Processing, 1999, 5 pgs.
Robertson et al., "Estimation-theoretic approach to dynamic range enhancement using multiple exposures", Journal of Electronic Imaging, Apr. 2003, vol. 12, No. 2, pp. 219-228.
Roy et al., "Non-Uniform Hierarchical Pyramid Stereo for Large Images", Computer and Robot Vision, 2007, pp. 208-215.
Sauer et al., "Parallel Computation of Sequential Pixel Updates in Statistical Tomographic Reconstruction", ICIP 1995, pp. 93-96.
Seitz et al., "Plenoptic Image Editing", International Journal of Computer Vision 48, 2, pp. 115-129.
Shum et al., "Pop-Up Light Field: An Interactive Image-Based Modeling and Rendering System", Apr. 2004, ACM Transactions on Graphics, vol. 23, No. 2, pp. 143-162. Retrieved from http://131.107.65.14/en-us/um/people/jiansun/papers/PopupLightField_TOG.pdf on Feb. 5, 2014.
Stollberg et al., "The Gabor superlens as an alternative wafer-level camera approach inspired by superposition compound eyes of nocturnal insects", Optics Express, Aug. 31, 2009, vol. 17, No. 18, pp. 15747-15759.
Sun et al., "Image Super-Resolution Using Gradient Profile Prior", Source and date unknown, 8 pgs.
Takeda et al., "Super-resolution Without Explicit Subpixel Motion Estimation", IEEE Transaction on Image Processing, Sep. 2009, vol. 18, No. 9, pp. 1958-1975.
Tallon et al., "Upsampling and Denoising of Depth Maps Via Joint-Segmentation", 20th European Signal Processing Conference, Aug. 27-31, 2012, 5 pgs.
Tanida et al., "Color imaging with an integrated compound imaging system", Optics Express, Sep. 8, 2003, vol. 11, No. 18, pp. 2109-2117.
Tanida et al., "Thin observation module by bound optics (TOMBO): concept and experimental verification", Applied Optics, Apr. 10, 2001, vol. 40, No. 11, pp. 1806-1813.
Taylor, "Virtual camera movement: The way of the future?", American Cinematographer, vol. 77, No. 9, Sep. 1996, pp. 93-100.
Vaish et al., "Reconstructing Occluded Surfaces Using Synthetic Apertures: Stereo, Focus and Robust Measures", Proceeding, CVPR '06 Proceedings of the 2006 IEEE Computer Society Conference on Computer Vision and Pattern Recognition—vol. 2, pp. 2331-2338.
Vaish et al., "Synthetic Aperture Focusing Using a Shear-Warp Factorization of the Viewing Transform", IEEE Workshop on A3DISS, CVPR, 2005, 8 pgs.
Vaish et al., "Using Plane + Parallax for Calibrating Dense Camera Arrays", IEEE Conference on Computer Vision and Pattern Recognition (CVPR), 2004, 8 pgs.
Veilleux, "CCD Gain Lab: The Theory", University of Maryland, College Park—Observational Astronomy (ASTR 310), Oct. 19, 2006, Retrieved from <URL: http://www.astro.umd.edu/~veilleux/ASTR310/fall06/ccd_theory.pdf> on May 13, 2014, 5 pgs.
Vuong et al., "A New Auto Exposure and Auto White-Balance Algorithm to Detect High Dynamic Range Conditions Using CMOS Technology", Proceedings of the World Congress on Engineering and Computer Science 2008, WCECS 2008, Oct. 22-24, 2008.
Wang, "Calculation of Image Position, Size and Orientation Using First Order Properties", 10 pgs.
Wetzstein et al., "Computational Plenoptic Imaging", Computer Graphics Forum, 2011, vol. 30, No. 8, pp. 2397-2426.
Wheeler et al., "Super-Resolution Image Synthesis Using Projections Onto Convex Sets in the Frequency Domain", Proc. SPIE, 2005, 5674, 12 pgs.
Wikipedia, , "Polarizing Filter (Photography)", http://en.wikipedia.org/wiki/Polarizing_filter_(photography), 1 pg.
Wilburn, "High Performance Imaging Using Arrays of Inexpensive Cameras", Thesis of Bennett Wilburn, Dec. 2004, 128 pgs.
Wilburn et al., "High Performance Imaging Using Large Camera Arrays", ACM Transactions on Graphics, Jul. 2005, vol. 24, No. 3, pp. 1-12.
Wilburn et al., "High-Speed Videography Using a Dense Camera Array", Proceeding, CVPR'04 Proceedings of the 2004 IEEE Computer Society Conference on Computer Vision and Pattern Recognition, pp. 294-301.
Wilburn et al., "The Light Field Video Camera", Proceedings of Media Processors 2002, SPIE Electronic Imaging, 2002, 8 pgs.
Wippermann et al., "Design and fabrication of a chirped array of refractive ellipsoidal micro-lenses for an apposition eye camera objective", Proceedings of SPIE, Optical Design and Engineering II, Oct. 15, 2005, 59622C-1-59622C-11.
Yang et al., "A Real-Time Distributed Light Field Camera", Eurographics Workshop on Rendering (2002), pp. 1-10.
Yang et al., "Superresolution Using Preconditioned Conjugate Gradient Method", Source and date unknown, 8 pgs.
Zhang, Qiang et al., "Depth estimation, spatially variant image registration, and super-resolution using a multi-lenslet camera", Proceedings of SPIE, vol. 7705, Apr. 23, 2010, pp. 770505-770505-8, XP055113797 ISSN: 0277-786X, DOI: 10.1117/12.852171.
Zhang et al., "A Self-Reconfigurable Camera Array", Eurographics Symposium on Rendering, 2004, 12 pgs.
Zomet et al., "Robust Super-Resolution", IEEE, 2001, pp. 1-6.
International Search Report and Written Opinion for International Application No. PCT/US2013/027146, completed Apr. 2, 2013, 12 pgs.
International Search Report and Written Opinion for International Application No. PCT/US2013/039155, Search completed Jul. 1, 2013, dated Jul. 11, 2013, 11 Pgs.
International Search Report and Written Opinion for International Application No. PCT/US2013/048772, Search Completed Oct. 21, 2013, dated Nov. 8, 2013, 11 pgs.
International Search Report and Written Opinion for International Application No. PCT/US2013/056502, Search Completed Feb. 18, 2014, dated Mar. 19, 2014, 7 pgs.
International Search Report and Written Opinion for International Application No. PCT/US2013/069932, International Filing Date Nov. 13, 2013, Search Completed Mar. 14, 2014, dated Apr. 14, 2014, 12 pgs.
International Search Report and Written Opinion for International Application No. PCT/US2015/019529, Search completed May 5, 2015, dated Jun. 8, 2015, 10 Pgs.
International Search Report and Written Opinion for International Application No. PCT/US2011/036349, dated Aug. 22, 2011, 11 pgs.
International Search Report and Written Opinion for International Application No. PCT/US2013/062720, report completed Mar. 25, 2014, dated Apr. 21, 2014, 9 Pgs.
International Search Report and Written Opinion for International Application No. PCT/US2014/024903 report completed Jun. 12, 2014, dated Jun. 27, 2014, 13 pgs.
International Search Report and Written Opinion for International Application No. PCT/US2014/017766, report completed May 28, 2014, dated Jun. 18, 2014, 9 Pgs.
International Search Report and Written Opinion for International Application No. PCT/US2014/018084, Report completed May 23, 2014, dated Jun. 10, 2014, 12 pgs.
International Search Report and Written Opinion for International Application No. PCT/US2014/018116, report completed May 13, 2014, dated Jun. 2, 2014, 12 Pgs.
International Search Report and Written Opinion for International Application No. PCT/US2014/022118, report completed Jun. 9, 2014, dated Jun. 25, 2014, 5 pgs.
International Search Report and Written Opinion for International Application No. PCT/US2014/022774 report completed Jun. 9, 2014, dated Jul. 14, 2014, 6 Pgs.
International Search Report and Written Opinion for International Application No. PCT/US2014/024407, report completed Jun. 11, 2014, dated Jul. 8, 2014, 9 Pgs.
International Search Report and Written Opinion for International Application No. PCT/US2014/025100, report completed Jul. 7, 2014, dated Aug. 7, 2014 5 Pgs.

(56) References Cited

OTHER PUBLICATIONS

International Search Report and Written Opinion for International Application No. PCT/US2014/025904 report completed Jun. 10, 2014, dated Jul. 10, 2014, 6 Pgs.
International Search Report and Written Opinion for International Application No. PCT/US2009/044687, completed Jan. 5, 2010, 13 pgs.
International Search Report and Written Opinion for International Application No. PCT/US2010/057661, completed Mar. 9, 2011, 14 pgs.
International Search Report and Written Opinion for International Application No. PCT/US2012/044014, completed Oct. 12, 2012, 15 pgs.
International Search Report and Written Opinion for International Application No. PCT/US2012/056151, completed Nov. 14, 2012, 10 pgs.
International Search Report and Written Opinion for International Application No. PCT/US2012/059813, Report completed Dec. 17, 2012, 8 pgs.
International Search Report and Written Opinion for International Application No. PCT/US2012/037670, dated Jul. 18, 2012, Report Completed Jul. 5, 2012, 9 pgs.
International Search Report and Written Opinion for International Application No. PCT/US2012/058093, Report completed Nov. 15, 2012, 12 pgs.
International Search Report and Written Opinion for International Application No. PCT/US2014/022123, report completed Jun. 9, 2014, dated Jun. 25, 2014, 5 pgs.
International Search Report and Written Opinion for International Application No. PCT/US2014/024947, Report Completed Jul. 8, 2014, dated Aug. 5, 2014, 8 Pgs.
International Search Report and Written Opinion for International Application No. PCT/US2014/028447, report completed Jun. 30, 2014, dated Jul. 21, 2014, 8 Pgs.
International Search Report and Written Opinion for International Application No. PCT/US2014/030692, report completed Jul. 28, 2014, dated Aug. 27, 2014, 7 Pages.
International Search Report and Written Opinion for International Application No. PCT/US2014/064693, Report Completed Mar. 7, 2015, dated Apr. 2, 2015, 15 pgs.
International Search Report and Written Opinion for International Application No. PCT/US2014/066229, Search Completed Mar. 6, 2015, dated Mar. 19, 2015, 9 Pgs.
International Search Report and Written Opinion for International Application No. PCT/US2014/067740, Report Completed Jan. 29, 2015, dated Mar. 3, 2015, 10 pgs.
International Search Report and Written Opinion for International Application No. PCT/US2014/023762, Report Completed May 30, 2014, dated Jul. 3, 2014, 6 Pgs.
Baker et al., "Limits on Super-Resolution and How to Break Them", IEEE Transactions on Pattern Analysis and Machine Intelligence, Sep. 2002, vol. 24, No. 9, pp. 1167-1183.
Bennett, Eric P. et al., "Multispectral Bilateral Video Fusion", 2007 IEEE Transactions on Image Processing, vol. 16, No. 5, pp. 1185-1194.
Bertero et al., "Super-resolution in computational imaging", Micron, 2003, vol. 34, Issues 6-7, 17 pgs.
Bishop et al., "Full-Resolution Depth Map Estimation from an Aliased Plenoptic Light Field", ACCV 2010, Part II, LNCS 6493, pp. 186-200.
Bishop et al., "Light Field Superresolution", Retrieved from http://home.eps.hw.ac.uk/~sz73/ICCP09/LightFieldSuperresolution.pdf, 9 pgs.
Bishop et al., "The Light Field Camera: Extended Depth of Field, Aliasing, and Superresolution", IEEE Transactions on Pattern Analysis and Machine Intelligence, May 2012, vol. 34, No. 5, pp. 972-986.
Borman, "Topics in Multiframe Superresolution Restoration", Thesis of Sean Borman, Apr. 2004, 282 pgs.
Borman et al., "Image Sequence Processing", Source unknown, Oct. 14, 2002, 81 pgs.
Borman et al., "Block-Matching Sub-Pixel Motion Estimation from Noisy, Under-Sampled Frames—An Empirical Performance Evaluation", Proc SPIE, Dec. 1998, 3653, 10 pgs.
Borman et al., "Image Resampling and Constraint Formulation for Multi-Frame Super-Resolution Restoration", Proc. SPIE, Jun. 2003, 5016, 12 pgs.
Borman et al., "Linear models for multi-frame super-resolution restoration under non-affine registration and spatially varying PSF", Proc. SPIE, May 2004, vol. 5299, 12 pgs.
Borman et al., "Nonlinear Prediction Methods for Estimation of Clique Weighting Parameters in NonGaussian Image Models", Proc. SPIE, 1998, 3459, 9 pgs.
Borman et al., "Simultaneous Multi-Frame MAP Super-Resolution Video Enhancement Using Spatio-Temporal Priors", Image Processing, 1999, ICIP 99 Proceedings, vol. 3, pp. 469-473.
Borman et al., "Super-Resolution from Image Sequences—A Review", Circuits & Systems, 1998, pp. 374-378.
Bose et al., "Superresolution and Noise Filtering Using Moving Least Squares", IEEE Transactions on Image Processing, date unknown, 21 pgs.
Boye et al., "Comparison of Subpixel Image Registration Algorithms", Proc. of SPIE-IS&T Electronic Imaging, vol. 7246, pp. 72460X-1-72460X-9.
International Preliminary Report on Patentability for International Application PCT/US10/057661, dated May 22, 2012, dated May 31, 2012, 10 pages.
International Preliminary Report on Patentability for International Application PCT/US2014/017766, dated Aug. 25, 2015, dated Sep. 3, 2015, 8 Pgs.
International Preliminary Report on Patentability for International Application PCT/US2014/018084, dated Aug. 25, 2015, dated Sep. 3, 2015, 11 Pgs.
International Preliminary Report on Patentability for International Application PCT/US2014/018116, dated Sep. 15, 2015, dated Sep. 24, 2015, 12 Pgs.
International Preliminary Report on Patentability for International Application PCT/US2014/021439, dated Sep. 15, 2015, dated Sep. 24, 2015, 9 Pgs.
International Preliminary Report on Patentability for International Application PCT/US2014/022118, dated Sep. 8, 2015, dated Sep. 17, 2015, 4 pgs.
International Preliminary Report on Patentability for International Application PCT/US2014/022123, dated Sep. 8, 2015, dated Sep. 17, 2015, 4 Pgs.
International Preliminary Report on Patentability for International Application PCT/US2014/022774, dated Sep. 22, 2015, dated Oct. 1, 2015, 5 Pgs.
International Preliminary Report on Patentability for International Application PCT/US2014/024407, dated Sep. 15, 2015, dated Sep. 24, 2015, 8 Pgs.
International Preliminary Report on Patentability for International Application PCT/US2014/024903, dated Sep. 15, 2015, dated Sep. 24, 2015, 12 Pgs.
International Preliminary Report on Patentability for International Application PCT/US2014/024947, dated Sep. 15, 2015, dated Sep. 24, 2015, 7 Pgs.
International Preliminary Report on Patentability for International Application PCT/US2014/025100, dated Sep. 15, 2015, dated Sep. 24, 2015, 4 Pgs.
International Preliminary Report on Patentability for International Application PCT/US2014/025904, dated Sep. 15, 2015, dated Sep. 24, 2015, 5 Pgs.
International Preliminary Report on Patentability for International Application PCT/US2014/028447, dated Sep. 15, 2015, dated Sep. 24, 2015, 7 Pgs.
International Preliminary Report on Patentability for International Application PCT/US2014/030692, dated Sep. 15, 2015, dated Sep. 24, 2015, 6 Pgs.
International Preliminary Report on Patentability for International Application PCT/US2014/064693, dated May 10, 2016, dated May 19, 2016, 14 Pgs.

(56) References Cited

OTHER PUBLICATIONS

International Preliminary Report on Patentability for International Application PCT/US2014/066229, dated May 24, 2016, dated Jun. 6, 2016, 9 Pgs.
International Preliminary Report on Patentability for International Application PCT/US2014/067740, dated May 31, 2016, dated Jun. 9, 2016, 9 Pgs.
International Preliminary Report on Patentability for International Application PCT/US2015/019529, dated Sep. 13, 2016, dated Sep. 22, 2016, 9 Pgs.
International Search Report and Written Opinion for International Application PCT/US14/21439, completed Jun. 5, 2014, dated Jun. 20, 2014, 10 Pgs.
Supplementary European Search Report for EP Application No. 13831768.0, Search completed May 18, 2016, dated May 30, 2016, 13 Pgs.
"File Formats Version 6", Alias Systems, 2004, 40 pgs.
"Light fields and computational photography", Stanford Computer Graphics Laboratory, Retrieved from: http://graphics.stanford.edu/projects/lightfield/, Earliest publication online: Feb. 10, 1997, 3 pgs.
U.S. Appl. No. 12/952,134, "Notice of Allowance Received", Notice of Allowance U.S. Appl. No. 12/952,134, report completed Jul. 24, 2014, Pub. Date Jul. 24, 2014, 8 Pgs.
Aufderheide et al., "A MEMS-based Smart Sensor System for Estimation of Camera Pose for Computer Vision Applications", Research and Innovation Conference 2011, Jul. 29, 2011, pp. 1-10.
Bennett et al, "Multispectral Video Fusion", Computer Graphics (ACM SIGGRAPH Proceedings), Jul. 25, 2006, 1 pg., published Jul. 30, 2006.
Crabb et al., "Real-time foreground segmentation via range and color imaging", 2008 IEEE Computer Society Conference on Computer Vision and Pattern Recognition Workshops, Anchorage, AK, USA, Jun. 23-28, 2008, pp. 1-5.
Debevec et al., "Recovering High Dynamic Range Radiance Maps from Photographs", Computer Graphics (ACM SIGGRAPH Proceedings), Aug. 16, 1997, 10 pgs.
Do, Minh N. "Immersive Visual Communication with Depth", Presented at Microsoft Research, Jun. 15, 2011, Retrieved from: http://minhdo.ece.illinois.edu/talks/ImmersiveComm.pdf, 42 pgs.
Do et al., "Immersive Visual Communication", IEEE Signal Processing Magazine, vol. 28, Issue 1, Jan. 2011, DOI: 10.1109/MSP.2010.939075, Retrieved from: http://minhdo.ece.illinois.edu/publications/ImmerComm_SPM.pdf, pp. 58-66.
Eng, Wei Yong et al., "Gaze correction for 3D tele-immersive communication system", IVMSP Workshop, 2013 IEEE 11th. IEEE, Jun. 10, 2013.
Fang et al., "Volume Morphing Methods for Landmark Based 3D Image Deformation", SPIE vol. 2710, Proc. 1996 SPIE Intl Symposium on Medical Imaging, Newport Beach, CA, Feb. 10, 1996, pp. 404-415.
Fecker et al., "Depth Map Compression for Unstructured Lumigraph Rendering", Proc. SPIE 6077, Proceedings Visual Communications and Image Processing 2006, Jan. 18, 2006, pp. 60770B-1-60770B-8.
Georgeiv et al., "Light Field Camera Design for Integral View Photography", Adobe Systems Incorporated, Adobe Technical Report, 2003, 13 pgs.
Georgiev et al., "Light-Field Capture by Multiplexing in the Frequency Domain", Adobe Systems Incorporated, Adobe Technical Report, 2003, 13 pgs.
Hernandez-Lopez et al., "Detecting objects using color and depth segmentation with Kinect sensor", Procedia Technology, vol. 3, Jan. 1, 2012, pp. 196-204, XP055307680, ISSN: 2212-0173, DOI: 10.1016/j.protcy.2012.03.021.
Holoeye, "Spatial Light Modulators", Photonics AG, Brochure retrieved from http://holoeye.com/wp-content/uploads/Spatial_Light_Modulators.pdf, printed Jun. 15, 2017, 4 pgs.
Konolige, Kurt, "Projected Texture Stereo", 2010 IEEE International Conference on Robotics and Automation, May 3-7, 2010, p. 148-155.
Kubota et al., "Reconstructing Dense Light Field From Array of Multifocus Images for Novel View Synthesis", IEEE Transactions on Image Processing, vol. 16, No. 1, Jan. 2007, pp. 269-279.
Li et al., "Fusing Images With Different Focuses Using Support Vector Machines", IEEE Transactions on Neural Networks, vol. 15, No. 6, Nov. 8, 2004, pp. 1555-1561.
Lim, Jongwoo, "Optimized Projection Pattern Supplementing Stereo Systems", 2009 IEEE International Conference on Robotics and Automation, May 12-17, 2009, pp. 2823-2829.
Martinez et al., "Simple Telemedicine for Developing Regions: Camera Phones and Paper-Based Microfluidic Devices for Real-Time, Off-Site Diagnosis", Analytical Chemistry (American Chemical Society), vol. 80, No. 10, May 15, 2008, pp. 3699-3707.
Ng et al., "Light Field Photography with a Hand-held Plenoptic Camera", Stanford Tech Report CTSR 2005-02, Apr. 20, 2005, pp. 1-11.
Nguyen et al., "Error Analysis for Image-Based Rendering with Depth Information", IEEE Transactions on Image Processing, vol. 18, Issue 4, Apr. 2009, pp. 703-716.
Nguyen et al., "Image-Based Rendering with Depth Information Using the Propagation Algorithm", Proceedings. (ICASSP '05). IEEE International Conference on Acoustics, Speech, and Signal Processing, 2005, vol. 5, Mar. 23-23, 2005, pp. II-589-II-592.
Nishihara, H.K., "PRISM: A Practical Real-Time Imaging Stereo Matcher", Massachusetts Institute of Technology, A.I. Memo 780, May 1984, 32 pgs.
Park et al., "Multispectral Imaging Using Multiplexed Illumination", 2007 IEEE 11th International Conference on Computer Vision, Oct. 14-21, 2007, Rio de Janeiro, Brazil, pp. 1-8.
Parkkinen et al., "Characteristic Spectra of Munsell Colors", Journal of the Optical Society of America A, vol. 6, Issue 2, Feb. 1989, pp. 318-322.
Stober, "Stanford researchers developing 3-D camera with 12,616 lenses", Stanford Report, Mar. 19, 2008, Retrieved from: http://news.stanford.edu/news/2008/march19/camera-031908.html, 5 pgs.
Taguchi et al., "Rendering-Oriented Decoding for a Distributed Multiview Coding System Using a Coset Code", Hindawi Publishing Corporation, EURASIP Journal on Image and Video Processing, vol. 2009, Article ID 251081, Online: Apr. 22, 2009, 12 pages.
Venkataraman et al., "PiCam: An Ultra-Thin High Performance Monolithic Camera Array", ACM Transactions on Graphics (TOG), ACM, US, vol. 32, No. 6, 1 Nov. 1, 2013, pp. 1-13.
Vetro et al., "Coding Approaches for End-To-End 3D TV Systems", Mitsubishi Electric Research Laboratories, Inc., TR2004-137, Dec. 2004, 6 pgs.
Wieringa et al., "Remote Non-invasive Stereoscopic Imaging of Blood Vessels: First In-vivo Results of a New Multispectral Contrast Enhancement Technology", Annals of Biomedical Engineering, vol. 34, No. 12, Dec. 2006, pp. 1870-1878, Published online Oct. 12, 2006.
Wu et al., "A virtual view synthesis algorithm based on image inpainting", 2012 Third International Conference on Networking and Distributed Computing, Hangzhou, China, Oct. 21-24, 2012, pp. 153-156.
Xu, Ruifeng, "Real-Time Realistic Rendering and High Dynamic Range Image Display and Compression", Dissertation, School of Computer Science in the College of Engineering and Computer Science at the University of Central Florida, Orlando, Florida, Fall Term 2005, 192 pgs.
Yokochi et al., "Extrinsic Camera Parameter Estimation Based-on Feature Tracking and GPS Data", 2006, Nara Institute of Science and Technology, Graduate School of Information Science, LNCS 3851, pp. 369-378.
Zheng et al., "Balloon Motion Estimation Using Two Frames", Proceedings of the Asilomar Conference on Signals, Systems and Computers, IEEE, Comp. Soc. Press, US, vol. 2 of 02, Nov. 4, 1991, pp. 1057-1061.
Extended European Search Report for EP Application No. 13810429.4, Completed Jan. 7, 2016, dated Jan. 15, 2016, 6 Pgs.
Extended European Search Report for European Application EP13751714.0, completed Aug. 5, 2015, dated Aug. 18, 2015, 8 Pgs.

(56) References Cited

OTHER PUBLICATIONS

Extended European Search Report for European Application EP13810229.8, Report Completed Apr. 14, 2016, dated Apr. 21, 2016, 7 pgs.
Extended European Search Report for European Application No. 13830945.5, Search completed Jun. 28, 2016, dated Jul. 7, 2016, 14 Pgs.
Extended European Search Report for European Application No. 13841613.6, Search completed Jul. 18, 2016, dated Jul. 26, 2016, 8 Pgs.
Extended European Search Report for European Application No. 14763087.5, Search completed Dec. 7, 2016, dated Dec. 19, 2016, 9 Pgs.
Extended European Search Report for European Application No. 14860103.2, Search completed Feb. 23, 2017, dated Mar. 3, 2017, 7 Pgs.
"Exchangeable image file format for digital still cameras: Exif Version 2.2", Japan Electronics and Information Technology Industries Association, Prepared by Technical Standardization Committee on AV & IT Storage Systems and Equipment, JEITA CP-3451, Apr. 2002, Retrieved from: http://www.exif.org/Exif2-2.Pdf, 154 pgs.
Van Der Wal et al., "The Acadia Vision Processor", Proceedings Fifth IEEE International Workshop on Computer Architectures for Machine Perception, Sep. 13, 2000, Padova, Italy, pp. 31-40.

* cited by examiner

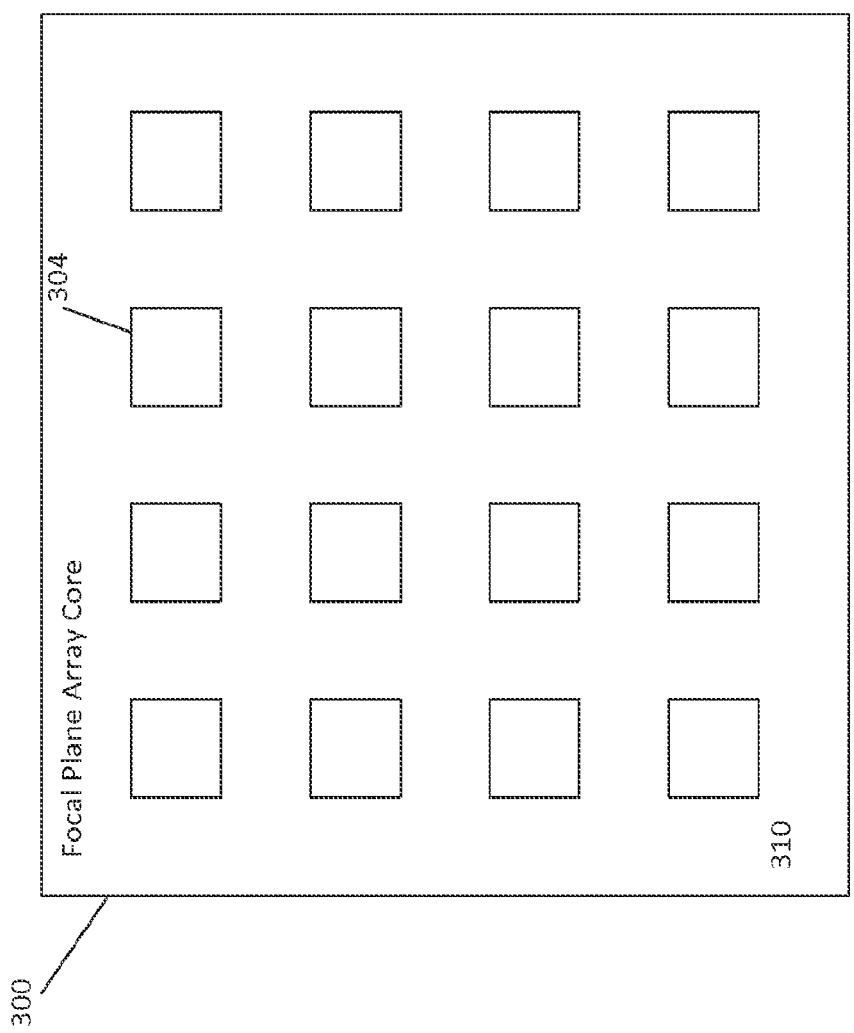

ARRAY CAMERA ARCHITECTURE IMPLEMENTING QUANTUM FILM IMAGE SENSORS

FIELD OF THE INVENTION

The present invention generally relates to array cameras and more specifically to systems and methods for implementing quantum film image sensors in array cameras.

BACKGROUND

In capturing an image in a typical camera, light enters through an opening (aperture) at one end of the camera and is directed to a focal plane by an optical array. In most cameras a lens stack including one or more layers of optical elements are placed between the aperture and the focal plane to focus light onto the focal plane. The focal plane consists of light sensitive pixels that generate signals upon receiving light via the optic array. Commonly used light sensitive sensors for use as light sensitive pixels include CCD (charge-coupled device) and CMOS (complementary metal-oxide-semiconductor) sensors.

Filters are often employed in the camera to selectively transmit lights of certain wavelengths onto the light sensitive pixels. In conventional cameras a Bayer filter mosaic is often formed on the light sensitive pixels. The Bayer filter is a color filter array that arranges one of the RGB color filters on each of the color pixels. The Bayer filter pattern includes 50% green filters, 25% red filters and 25% blue filters. Since each pixel generates a signal representing strength of a color component in the light and not the full range of colors, demosaicing is performed to interpolate a set of red, green and blue values for each pixel.

Cameras are subject to various performance constraints. The performance constraints for cameras include, among others, dynamic range, signal to noise (SNR) ratio and low light sensitivity. The dynamic range is defined as the ratio of the maximum possible signal that can be captured by a pixel to the total noise signal. The maximum possible signal in turn is dependent on the strength of the incident illumination and the duration of exposure (e.g., integration time, and shutter width). The signal to noise ratio (SNR) of a captured image is, to a great extent, a measure of image quality. In general, as more light is captured by the pixel, the higher the SNR. Accordingly, the SNR of a captured image is usually related to the light gathering capability of the pixel.

Generally, Bayer filter sensors have low light sensitivity. At low light levels, each pixel's light gathering capability is constrained by the low signal levels incident upon each pixel. In addition, the color filters over the pixel and the necessity to confine the chief ray angle incident on the pixel to avoid cross-talk further constrain the signal reaching the pixel. IR (Infrared) filters also reduce the photo-response from near-IR signals, which can carry valuable information. These performance constraints are greatly magnified in cameras designed for mobile systems due to the nature of design constraints. Pixels for mobile cameras are typically much smaller than the pixels of digital still cameras (DSC). Due to limits in light gathering ability, reduced SNR, limits in the dynamic range, and reduced sensitivity to low light scenes, the cameras in mobile cameras show poor performance.

Quantum dots are semiconductor particles that can take any number of shapes including cubes, spheres, pyramids, etc., and have a size that is comparable to the Bohr radius of the separation of electron and hole (exciton). The electronic characteristics of quantum dots are closely related to the size and shape of the individual crystal. In particular, when the size of the quantum dot is smaller than the exciton Bohr radius, the electrons crowd together leading to the splitting of the original energy levels into smaller ones with smaller gaps between each successive level. Thus, if the size of the quantum dot is small enough that the quantum confinement effects dominate (typically less than 10 nm), the electronic and optical properties change, and the fluorescent wavelength is determined by the particle size. In general, the smaller the size of the quantum dot particle, the larger the band gap, the greater becomes the difference in energy between the highest valence band and the lowest conduction band, therefore more energy is needed to excite the dot, and concurrently, more energy is released when the crystal returns to its resting state. For example, in fluorescent dye applications, this equates to higher frequencies of light emitted after excitation of the dot as the crystal size grows smaller, resulting in a color shift from red to blue in the light emitted. Beneficial to this tuning is that a high level of control over the size of the quantum dot particles produced is possible. As a result, it is possible to have very precise control over the fluorescent properties of quantum dot materials.

Quantum dots can be assembled into light sensitive quantum films that can be integrated onto a silicon wafer at the pixel level to replace the silicon photodiode-parts of a CCD or CMOS sensor. These quantum films are significantly more sensitive to light than are standard CMOS sensors that utilize a silicon photodiode. In addition, because the photosensitive volumes of the quantum film is not deep in the structure, as it is in a CMOS image sensor, but at the light sensitive quantum film surface, there is reduced cross talk between neighboring pixels, which relaxes lens CRA requirements.

SUMMARY OF THE INVENTION

Systems and methods in accordance with embodiments of the invention utilize quantum film imagers in the construction of array cameras. One embodiment of the invention includes: a plurality of focal planes, where each focal plane comprises a plurality of rows of pixels that also form a plurality of columns of pixels and each focal plane is contained within a region of the imager array that does not contain pixels from another focal plane; at least one quantum film located on the surface of the imager array, where each quantum film comprises a plurality of quantum dots; control circuitry configured to control the capture of image information by the pixels within the focal planes, where the control circuitry is configured so that the capture of image information by the pixels in at least two of the focal planes is separately controllable; and sampling circuitry configured to convert pixel outputs into digital pixel data.

Another embodiment of the invention includes an imager array including: a plurality of focal planes, where each focal plane comprises a plurality of rows of pixels that also form a plurality of columns of pixels and each focal plane is contained within a region of the imager array that does not contain pixels from another focal plane; at least one quantum film located on the surface of the imager array, where each quantum film comprises a plurality of quantum dots; control circuitry configured to control the capture of image information by the pixels within the focal planes, where the control circuitry is configured so that the capture of image information by the pixels in at least two of the focal planes is separately controllable; and sampling circuitry configured to convert pixel outputs into digital pixel data. In addition, the array camera includes an optic array of lens stacks aligned with respect to the imager array so that an image is formed on each focal plane by a separate lens stack in said optic array of lens stacks.

BRIEF DESCRIPTION OF THE DRAWINGS

FIG. 3A is a block diagram of an imager array in accordance with an embodiment of the invention.

DETAILED DISCLOSURE OF THE INVENTION

Figure 1:
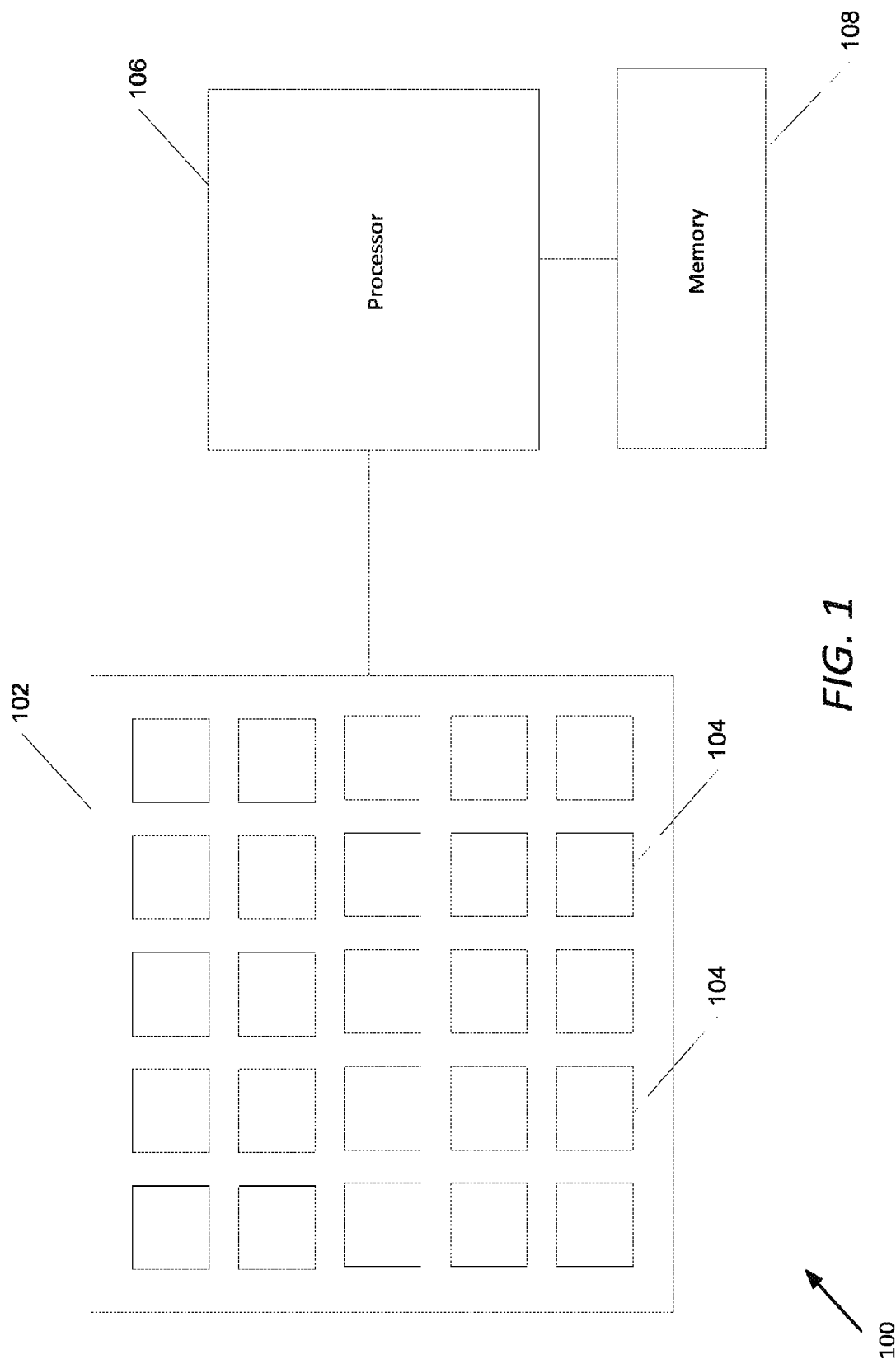
FIG. 1 is a block diagram of an array camera in accordance with an embodiment of the invention.

Turning now to the drawings, systems and methods for implementing quantum film imagers on array cameras in accordance with embodiments of the invention are illustrated. Many embodiments relate to using quantum film imagers as image sensors in camera modules of array cameras.

Array cameras including camera modules that can be utilized to capture image data from different viewpoints (i.e. light field images) are disclosed in U.S. patent application Ser. No. 12/935,504 entitled "Capturing and Processing of Images using Monolithic Camera Array with Heterogeneous Imagers" to Venkataraman et al. In many instances, fusion and super-resolution processes such as those described in U.S. patent application Ser. No. 12/967,807 entitled "Systems and Methods for Synthesizing High Resolution Images Using Super-Resolution Processes" to Lelescu et al., can be utilized to synthesize a higher resolution 2D image or a stereo pair of higher resolution 2D images from the lower resolution images in the light field captured by an array camera. The terms high or higher resolution and low or lower resolution are used here in a relative sense and not to indicate the specific resolutions of the images captured by the array camera. The disclosures of U.S. patent application Ser. No. 12/935,504 and U.S. patent application Ser. No. 12/967,807 are hereby incorporated by reference in their entirety.

Each two-dimensional (2D) image in a captured light field is from the viewpoint of one of the cameras in the array camera. Due to the different viewpoint of each of the cameras, parallax results in variations in the position of foreground objects within the images of the scene. Processes such as those disclosed in U.S. Provisional Patent Application No. 61/691,666 entitled "Systems and Methods for Parallax Detection and Correction in Imaged Captured Using Array Cameras" to Venkataraman et al. can be utilized to provide an accurate account of the pixel disparity as a result of parallax between the different cameras in an array. The disclosure of U.S. Patent Application Ser. No. 61/691,666 is hereby incorporated by reference in its entirety. Array cameras can use disparity between pixels in images within a light field to generate a depth map from a reference viewpoint. A depth map indicates the distance of the surfaces of scene objects from the reference viewpoint and can be utilized to determine scene dependent geometric corrections to apply to the pixels from each of the images within a captured light field to eliminate disparity when performing fusion and/or super-resolution processing.

In further embodiments, each camera in an array camera may include separate optics with different filters and operate with different operating parameters (e.g., exposure time). In many embodiments, the separate optics incorporated into each imager are implemented using a lens stack array. The lens stack array can include one or more optical elements, including color filters, that can be fabricated using wafer level optics (WLO) technology and/or any other technology appropriate for manufacturing lens stack arrays. In many embodiments, each of the cameras includes a quantum film configured with special color filters to receive certain wavelengths of light. Systems and methods for using quantum films to capture image data within an array camera in accordance with embodiments of the invention are discussed further below.

Array Cameras

Array cameras in accordance with embodiments of the invention can include a camera module and a processor. An array camera in accordance with an embodiment of the invention is illustrated in FIG. 1. The array camera 100 includes a camera module 102 with an array of individual cameras 104 where an array of individual cameras refers to a plurality of cameras in a particular arrangement, such as (but not limited to) the square arrangement utilized in the illustrated embodiment. The camera module 102 is connected to the processor 106 and the processor 106 is connected to a memory 108. Although a specific array camera is illustrated in FIG. 1, any of a variety of different array camera configurations can be utilized in accordance with many different embodiments of the invention. Multiple camera arrays may operate in conjunction to provide extended functionality over a single camera array, such as, for example, stereo resolution.

Array Camera Modules

Figure 2:
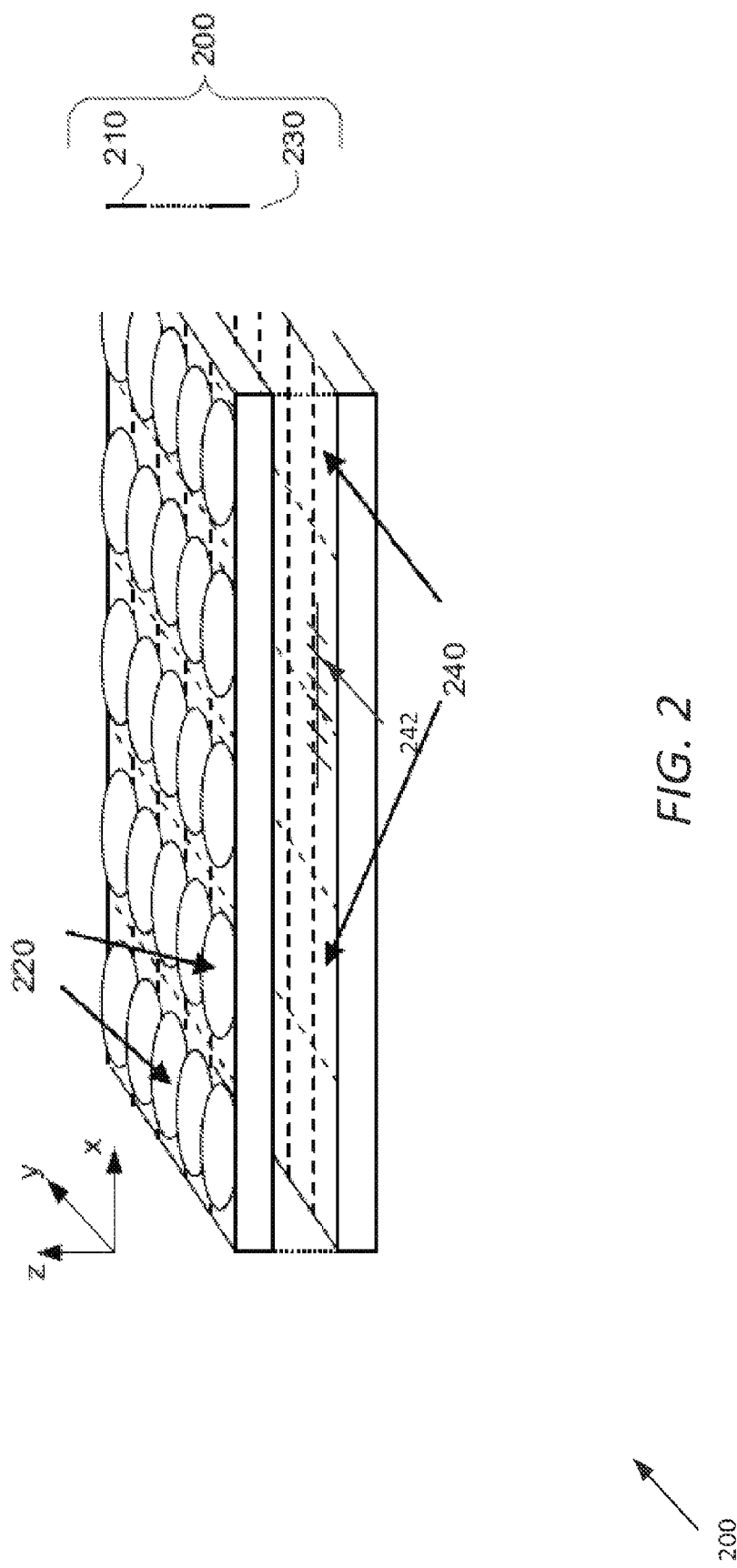
FIG. 2 conceptually illustrates an optic array and an imager array in an array camera module in accordance with an embodiment of the invention.

Camera modules in accordance with embodiments of the invention can be constructed from an imager array and an optic array. A camera module in accordance with an embodiment of the invention is illustrated in FIG. 2. The camera module 200 includes an imager array 230 including an array of focal planes 240 along with a corresponding optic array 210 including an array of lens stacks 220. Within the array of lens stacks, each lens stack 220 creates an optical channel that forms an image of the scene on an array of light sensitive pixels 242 within a corresponding focal plane 240. As is described further below, the light sensitive pixels 242 can be formed from quantum films. Each pairing of a lens stack 220 and focal plane 240 forms a single camera 104 within the camera module. Each pixel within a focal plane 240 of a camera 104 generates image data that can be sent from the camera 104 to the processor 108. In many embodiments, the lens stack within each optical channel is configured so that pixels of each focal plane 240 sample the same object space or region within the scene. In several embodiments, the lens stacks are configured so that the pixels that sample the same object space do so with sub-pixel offsets to provide sampling diversity that can be utilized to recover increased resolution through the use of super-resolution processes. The camera module may be fabricated on a single chip for mounting or installing in various devices.

In several embodiments, an array camera generates image data from multiple focal planes and uses a processor to synthesize one or more images of a scene. In certain embodiments, the image data captured by a single focal plane in the sensor array can constitute a low resolution image (the term low resolution here is used only to contrast with higher resolution images), which the processor can use in combination with other low resolution image data captured by the camera module to construct a higher resolution image through Super Resolution processing.

Quantum Film Focal Plane Imager Arrays

Figure 3B:
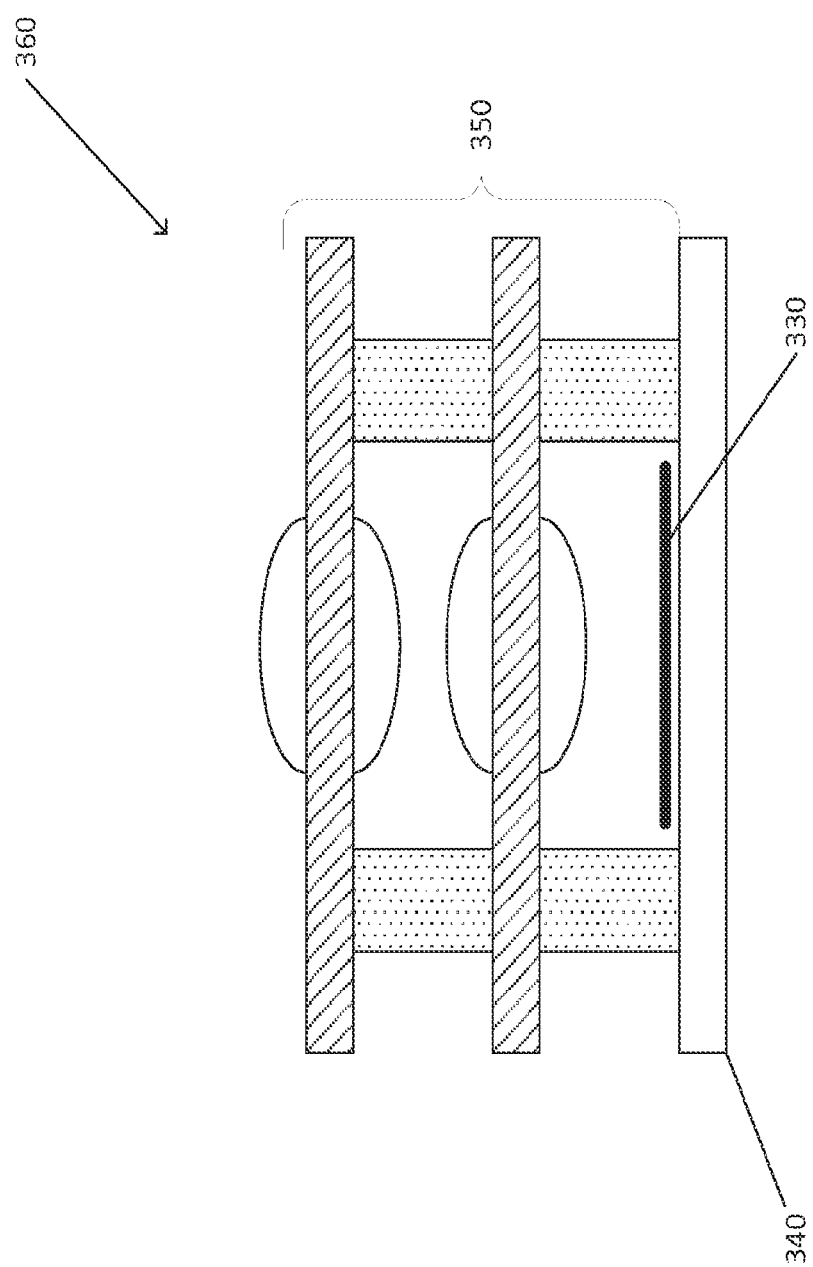
FIG. 3B is a cross-sectional illustration of a camera channel incorporating a light sensitive quantum film sensor in accordance with an embodiment of the invention.

Imager arrays in accordance with embodiments of the invention can be constructed from an array of focal planes formed of arrays of light sensitive pixels. As discussed above in relation to FIG. 2, in many embodiments the imager array 230 is composed of multiple focal planes 240, each of which have a corresponding lens stack 220 that directs light from the scene through optical channel and onto a plurality of light sensing elements formed on the focal plane 240. Typically the light sensing elements are formed on a CMOS device using photodiodes formed in the silicon where the depleted areas used for photon to electron conversion are disposed at specific depths within the bulk of the silicon. In many embodiments, a focal plane of an array of light sensitive pixels formed from a quantum film sensor may be implemented. A quantum film focal plane in accordance with an embodiment of the invention is illustrated in FIGS. 3A and 3B. The focal plane 300 includes a focal plane array core 310 that includes an array of light sensitive pixels 320 formed from a light sensing quantum film 330 of quantum dots disposed at the focal plane of the lens stack 350 of a camera 360 on a semiconducting integrated circuit substrate 340, such as a CMOS or CCD. The focal plane can also include all analog signal processing, pixel level control logic, signaling, and analog-to-digital conversion (ADC) circuitry used in the readout of pixels. The lens stack 350 of the camera 360 directs light from the scene and onto the light sensing quantum film 330. In many embodiments the light sensitive quantum film may be coated or otherwise disposed directly or indirectly onto crystallized silicon, such as, for example, an integrated circuit configured to provide the necessary signaling, etc. The formation, architecture and operation of imager arrays and light sensitive pixel arrays, and their use in optical detection in association with array cameras are described in U.S. patent application Ser. No. 13/106,797, entitled "Architectures for Imager Arrays and Array Cameras", filed May 12, 2011, the disclosure of which is incorporated by reference herein in its entirety.

A light sensitive quantum film utilized in accordance with embodiments of the invention may employ colloidal quantum dots that are quantum size-effect tunable. This tunability means that quantum films may be made that are either homogeneous (meaning that incorporate a mixture of quantum dots with different spectral absorption characteristics) such that the film is sensitive to light across a wide spectral range (from UV-VIS to IR), or structured such that only quantum dots that absorb over a specific spectral band are included in the film. It should be understood that spectral bands for which structured films can be formed are not limited to any spectral region and may include X-ray, UV, visible (including specific spectral bands within the visible spectrum such as red, green, and blue), near-infrared, and short-wavelength infrared.

A light sensitive quantum film used in the construction of pixels within the focal plane of an array camera may also provide built-in bias-dependent and/or intensity-dependent gain which may simplify read-out circuit design and enable the use of an enhanced dynamic range. The formation, composition, performance and function of various quantum films, and their use in optical detection in association with semiconductor integrated circuits are described in U.S. Patent Publication U.S./2009/0152664, entitled "Materials, Systems and Methods for Optoelectronic Devices", published Jun. 18, 2009, the disclosure of which is incorporated by reference herein in its entirety.

Optical Crosstalk

Figure 4:
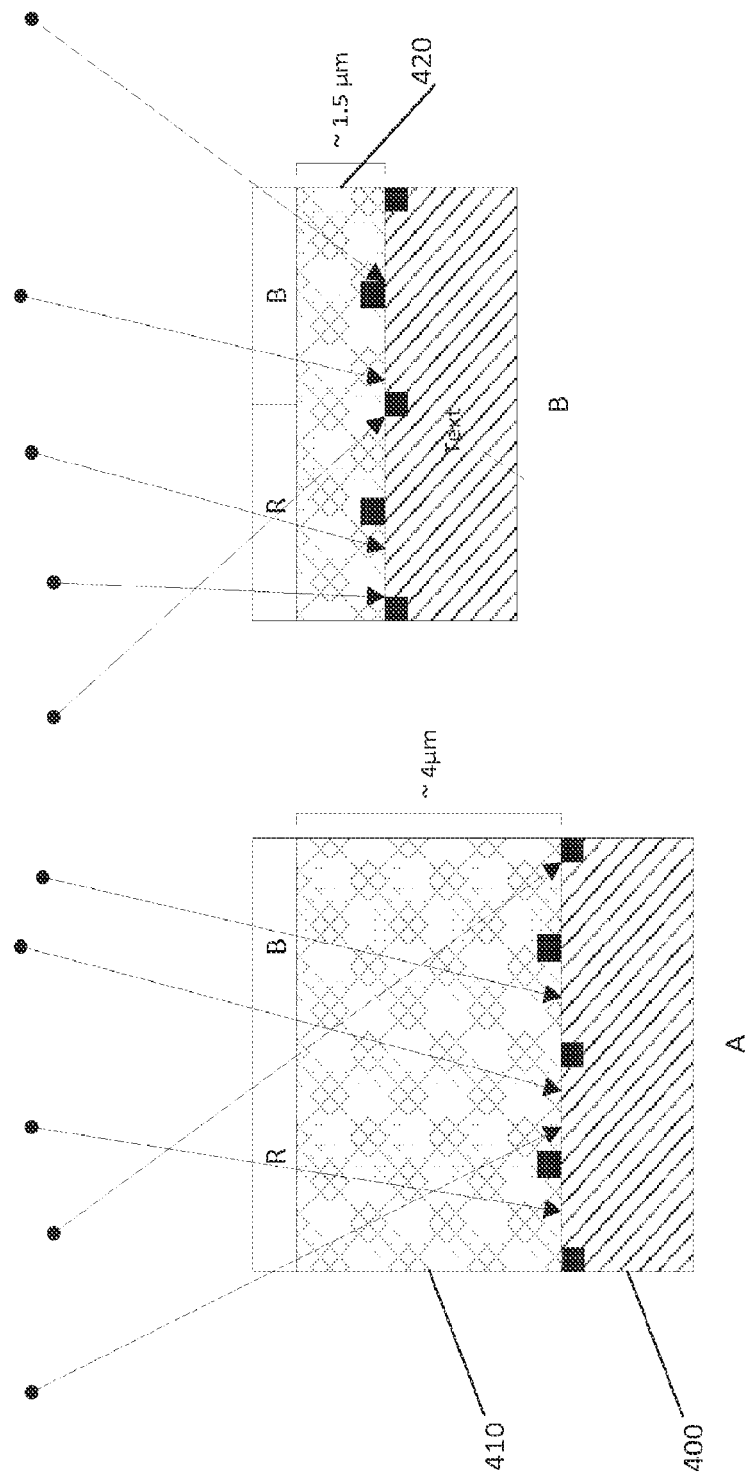
FIG. 4 conceptually illustrates crosstalk between pixels in cameras having: (A) the photodiodes in the Silicon (as in a conventional CMOS), and (B) having the photon to electron conversion in the light sensitive quantum film.
Figure 5:
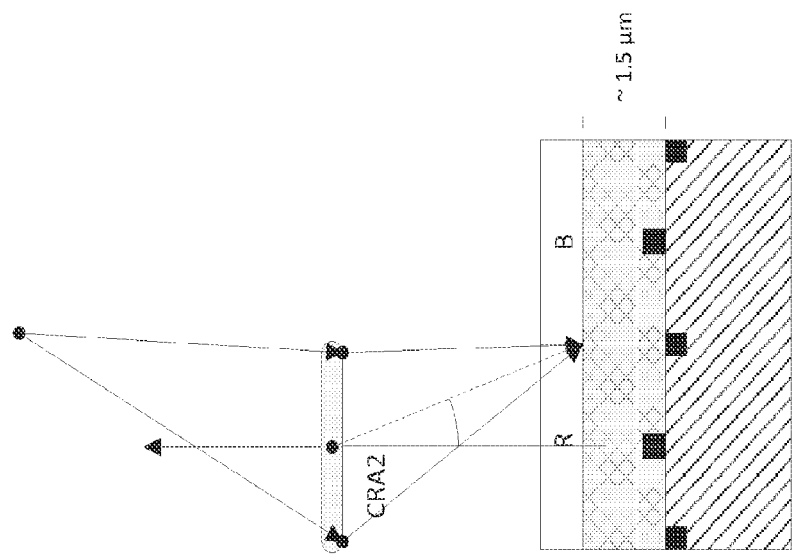
FIG. 5 conceptually illustrates chief ray angles for cameras having: (A) a conventional CMOS, and (B) a CMOS where the photodiode is implemented with a light sensitive quantum film.
Figure 5:
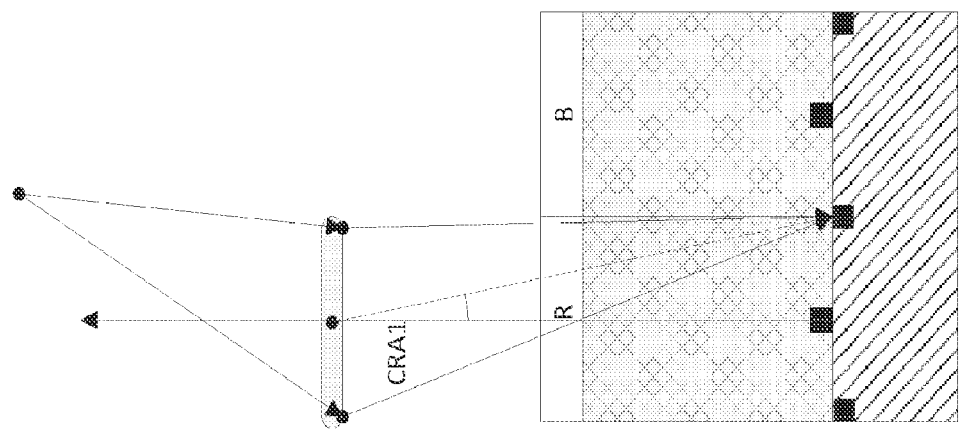

As illustrated in FIG. 4, an issue with silicon-based light-sensitive elements, such as are used in conventional CMOS devices (A), is that the light sensitive elements 400 are disposed within the volume of the silicon crystal 410, that is, that photon absorption takes place over the full length of the silicon crystal 410 at different depths within the crystal (typically first blue, then green, then red). The result is that, when color channels ((R)ed and (B)lue for example) are mapped on adjacent pixels, such as with a Bayer filter disposed atop the focal plane, the risk of optical crosstalk between pixels is increased. Any crosstalk between optical channels can introduce artifacts in the image data. In particular, crosstalk between optical channels means that an imager will sense the flux from a source on the pixel or focal plane that is inconsistent with the reconstructed position of the image of that pixel and the position of the image. This results in both a loss of image data, and the introduction of overlapping noise that cannot be distinguished from real image data. Crosstalk between pixels in the same color channel can also lead to an increase in blurriness and/or other artifacts. To address this, it is typically necessary to dispose microlenses above the pixels to direct the incident light through the bulk of the silicon crystal substrate and avoid crosstalk. In contrast, having the light sensitive material (420) at the surface of the focal plane as when using light sensitive quantum film (B), rather than within the silicon crystal bulk, limits the potential of optical crosstalk, which in turn provides a number of benefits. In particular, direct incidence of light through the lens stack onto the light sensitive pixel (e.g., quantum film) can be achieved without requiring optical manipulation, such as through microlenses. As illustrated in FIG. 5, the use of microlenses and the requirement to navigate the bulk of the silicon crystal (A) to reach the light-sensitive element in the conventional CMOS systems limits the acceptable chief ray angle (CRA 1) and also requires shifting of microlenses across the image sensor, rendering the image sensor design tightly coupled to micoroptics design. Reducing the thickness of the sensor allows for the use of a larger CRA for the cameras in an array camera. Accordingly, using a quantum film imager can achieve the maximal conveyance of light to the light-sensitive device, providing for increased sensitivity, and reduced optical crosstalk. Moreover, while embodiments of quantum film sensor cameras may use lenses or microlenses, in many embodiment microlenses are eliminated entirely. All of these factors improve the quality of the system by relaxing limitations (to the upper side) with respect to the CRA (CRA 2) which, in turn, results in a lower F# and improved Modulation Transfer Function (MTF).

Figure 6A:
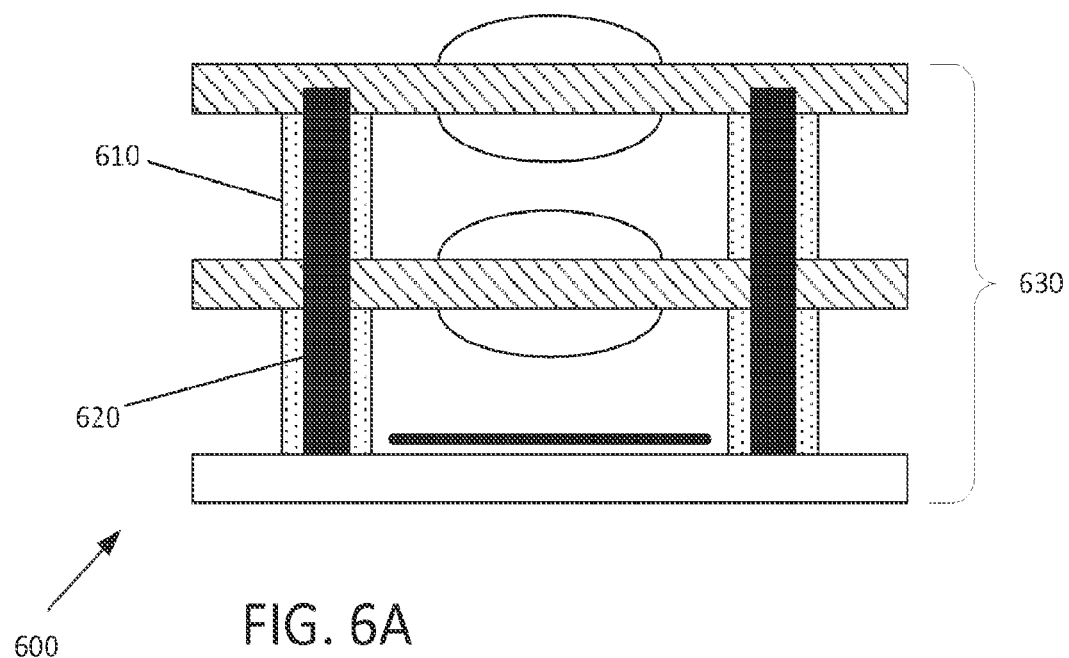
FIG. 6A is a cross-sectional illustration of a camera channel incorporating vertical optical isolation arrangements in accordance with an embodiment of the invention.
Figure 6B:
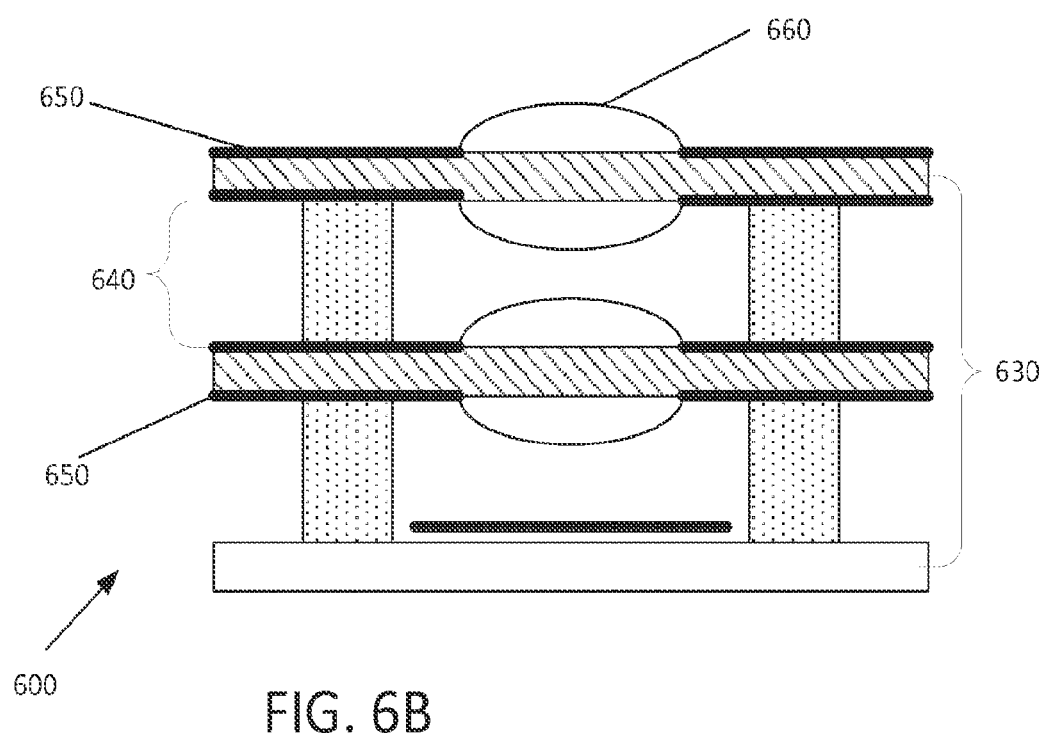
FIG. 6B is a cross-sectional illustration of a camera channel incorporating horizontal optical isolation arrangements in accordance with an embodiment of the invention.

In addition to implementing a light sensitive quantum film, embodiments may also include optical crosstalk suppressors for ensuring that light impinging on any particular focal plane comes only from its designated optical pathway or channel. Optical crosstalk suppressors used in accordance with embodiments of the invention are shown in FIGS. 6A and 6B. Optical crosstalk can be considered to occur when light that is supposed to be incident on the top of one focal plane is instead also received by light sensing elements of another focal plane within the array. Accordingly, in many embodiments optical channels of the camera array are optically isolated so that a ray of light from one optical channel cannot cross to another optical channel. In some embodiments, illustrated in FIG. 6A, lens stacks 600 are formed with opaque spacers 610 or vertical opaque walls 620, which may be disposed between the optical channels 630. Although opaque spacers do provide a level of optical crosstalk suppression, vertical opaque walls are preferable because in such an embodiment both the space between substrates and the relevant sections of the substrates themselves are rendered non-transparent. In other embodiments, shown schematically in FIG. 6B, optical crosstalk suppression is achieved by creating a virtual opaque wall formed by a series of stacked apertures. In this embodiment, a series of aperture stops are formed on the various substrate levels 640 of the optical channel 600 by coating the substrates with opaque layers 650 provided with a narrow opening or aperture 660. If enough of these apertures are formed, it is possible to mimic the optical isolation provided by a vertical opaque wall. In such a system, a vertical wall would be the mathematical limit of stacking apertures one on top of each other. Preferably, as many apertures as possible, separated from each other by sufficient space, are provided so that such a virtual opaque wall is created. For any lens stack, the number and placement of opaque layers needed to form such a virtual vertical opaque wall can be determined through a ray tracing analysis.

Although specific structure and components for preventing optical crosstalk are described above, any of a variety of arrangement for reducing crosstalk can be constructed in accordance with embodiments of the invention.

Color Information

Figure 7:
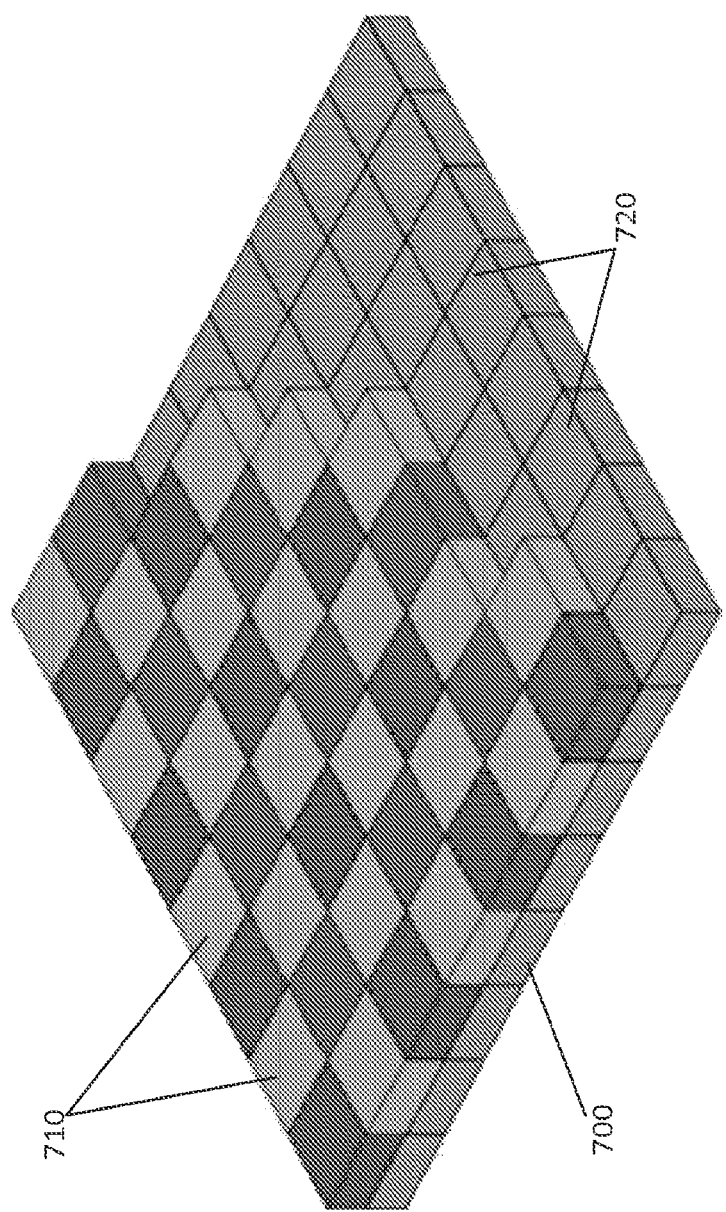
FIG. 7 conceptually illustrates a Bayer filter applied at the pixel level of a light sensitive element.

In order to obtain information about the color of an image, light can be separated into spectral bands and then directed to different color channels. In conventional monolithic cameras this typically involves applying color filters to the individual pixels of the focal plane of the camera. As shown in FIG. 7, when using a light sensitive quantum film sensor this is accomplished by using a homogeneous mixture of quantum dots within the film that absorb across a broad range of spectral bands (UV-VIS) and then forming over this focal plane quantum film (700) an array of color filters (710) indexed to the underlying pixel geometry (720). However, even in a focal plane incorporating a light sensitive quantum film, because the pixels (710) of the focal plane are tightly packed, light rays traversing adjacent color filters can impact the light-sensitive element of an adjacent pixel, producing crosstalk between neighboring light-sensitive pixels that are associated with different color filters. To reduce pixel crosstalk in these conventional monolithic cameras optical elements such as, for example, optical crosstalk suppressors that block stray radiation, microlenses that focus light onto the individual pixels, or image data processing to resolve crosstalk among pixels can be utilized. Thus, the requirement that color filters be implemented on a pixel level and the concomitant need to resolve spatial differences between a filter or other optical elements (such as microlenses) and the light sensing pixel obviates many of the advantages obtained by incorporating a light-sensitive quantum film in the imager array. In conventional monolithic cameras, the alternative to using a homogeneous light sensitive quantum film and a pixel-level color filter is to form color-selective stacked pixels, in which a plurality of optically-sensitive layers are superimposed in the vertical direction. In these systems the quantum film layers are selected to have a decreasing bandgap such that the upper layer or layers provide sensing of shorter-wavelength light and the lower layer or layers primarily sense longer-wavelength light. Then contacts are made to each of the different layers and the various signals processed on a pixel by pixel basis to separate out the various spectral bands. Although such layered quantum film structures obviate the need for pixel-level color filters, it increases the complexity of the light-sensitive element and related signal processing.

Figure 8:
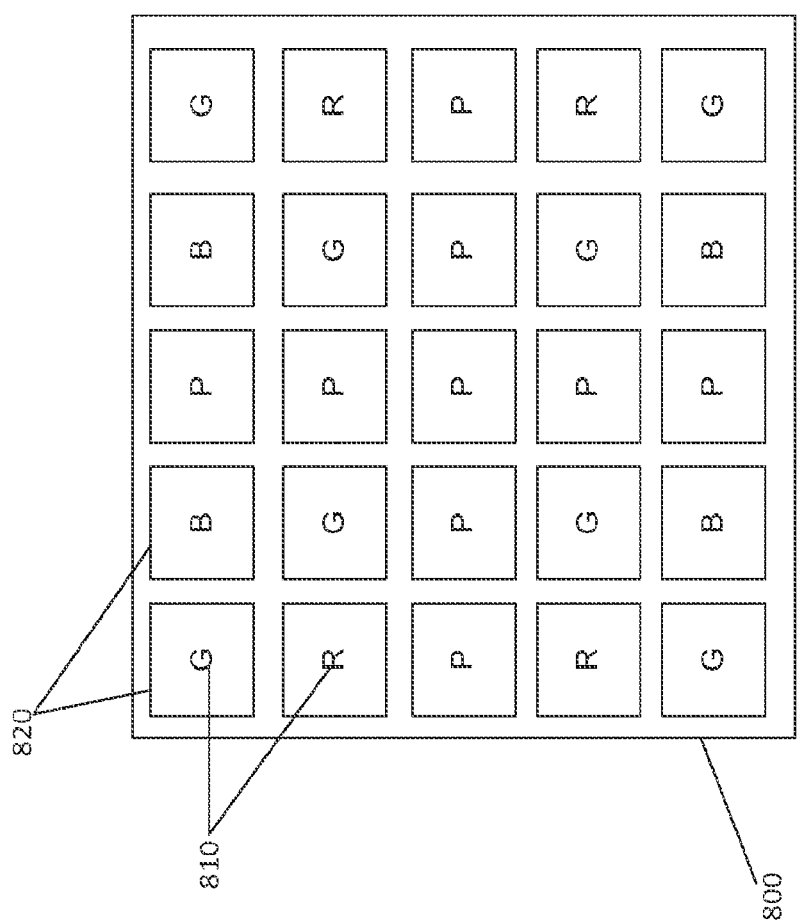
FIG. 8 is a plan view of a camera array having spectral filtration applied at the camera level in accordance with an embodiment of the invention.

The above discussion of separating light into different color channels has focused on the case where optically different camera channels (e.g., color channels or the like) are implemented on a pixel-by-pixel basis. As illustrated in FIG. 8, in many embodiments of the array camera (800), color filters (810) differentiated at the camera level (820) can be used to pattern the camera module. Example filters include a traditional filter used in the Bayer pattern (R, G, B or their complements C, M, Y), an IR-cut filter, a near-IR filter, a polarizing filter, and a custom filter to suit the needs of hyper-spectral imaging, and/or a polychromatic (P) filter. The number of distinct filters may be as large as the number of cameras in the camera array. Embodiments where $\pi$ filter groups are formed are further discussed in U.S. Provisional Patent Application No. 61/641,165 entitled "Camera Modules Patterned with pi Filter Groups" filed May 1, 2012, the disclosure of which is incorporated by reference herein in its entirety. These cameras can be used to capture data with respect to different colors, or a specific portion of the spectrum. Accordingly, instead of applying color filters at the pixel level of the camera, color filters in many embodiments of the invention are included in the lens stack of the camera. For example, a green color camera can include a lens stack with a green light filter that allows green light to pass through the optical channel. In many embodiments, the pixels in each focal plane are the same and the light information captured by the pixels is differentiated by the color filters in the corresponding lens stack for each filter The ability to apply color filters at a camera level and not at a pixel level means that the color filter may be applied either directly at the focal plane or in the lens stack. Accordingly, in some embodiments the color filter is applied at the focal plane directly on the light sensitive quantum film across the entire camera and not at the pixel level. Such an arrangement relaxes the CRA limitations for the microlenses to focus the incoming light through the color filter onto the focal plane, because there is no need to separate the incoming light between the individual pixels of the pixel array to avoid crosstalk. Alternatively, in other embodiments the color filter is applied within the lens stack of the camera and not at the focal plane. Placing the color filter within the lens stack can remove the need for microlenses entirely thereby significantly reducing the overall sensor cost.

Although a specific construction of camera modules with an optic array including color filters in the lens stacks is described above, camera modules including color filters and π filter groups can be implemented in a variety of ways. In several embodiments, at least one of the cameras in the camera module can include uniform color filters applied to the pixels in its focal plane. In many embodiments, a Bayer filter pattern is applied to the pixels of one of the cameras in a camera module either as the sole color filter or in combination with a camera level filter. In some number of embodiments, camera modules are constructed in which color filters are utilized in both the lens stacks and on the pixels of the imager array.

Furthermore, in many embodiments the structured color filter and (VIS-sensitive) homogeneous quantum film light sensitive sensor are replaced by a structured quantum film light sensitive sensor. In such embodiments, a structured light sensitive quantum film sensor is configured to include quantum dots that are sensitive only to a narrow spectral band. Tunability of the spectral band at the sensor level allows for potentially narrower spectral bands at more desired spectral positions. In many embodiments such a structured quantum film light sensitive sensor would be applied at camera level. This would allow for the formation of the quantum film on the lateral scale of several hundreds of microns to a few millimeters. Such a structure would be much simplified compared to applying a number of different structured quantum film sensors, each tuned to a different spectral band (such as in a Bayer pattern) at the pixel level.

Accordingly, in many embodiments of array cameras, color separation is implemented through a homogeneous quantum film an associated homogeneous color filter paired on each focal plane. In such embodiments, different focal planes could then be associated with different color filters, but could, in some instances use identical homogeneous quantum films. In other embodiments of array cameras, color separation is implemented by associating differently spectrally tuned quantum films with each focal plan, thereby rendering the need for color filters unnecessary.

Lens Stack Arrangements

Figure 9:
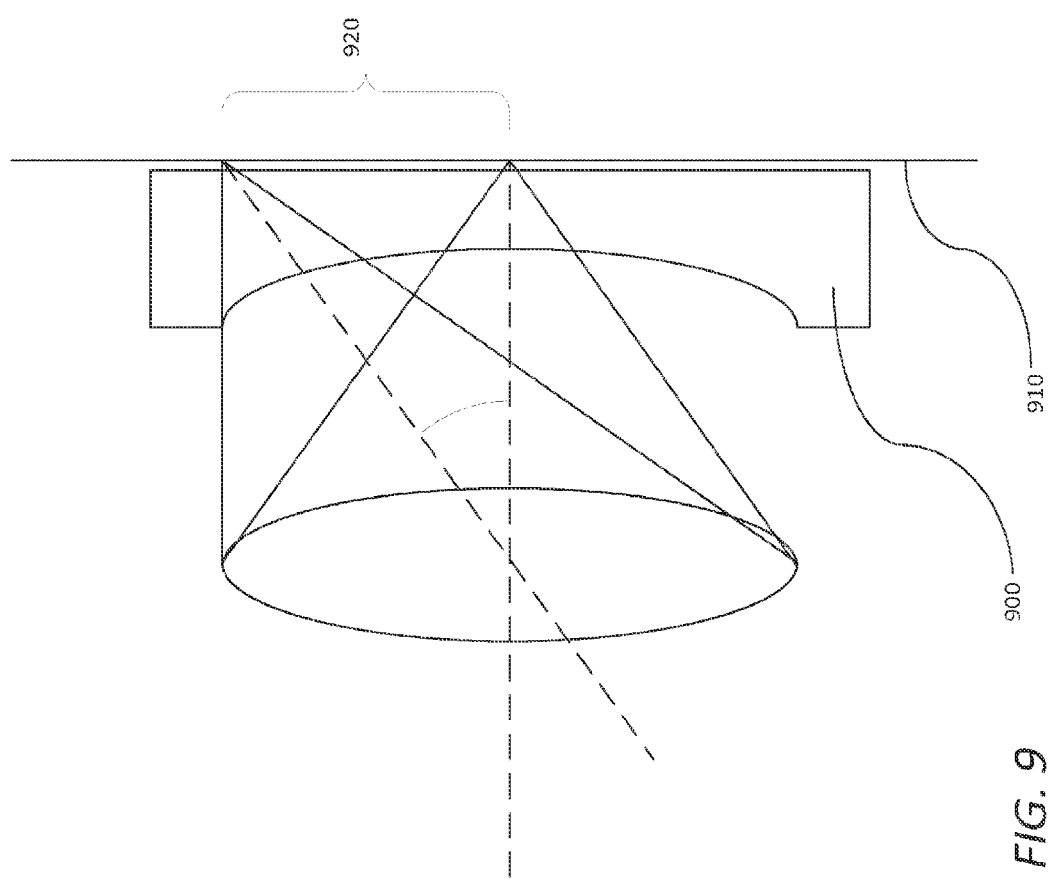
FIG. 9 conceptually illustrates the application of a negative lens element to a focal plane in accordance with an embodiment of the invention.

Another issue raised in camera design is how to correct for field curvature. An image projected through a lens is not planar, but has an inherently curved surface. As illustrated in FIG. 9 one way to correct this field curvature is to position a thick negative lens element 900 close to or directly on the focal plane 910. The negative lens element planarizes the various angled beams of light 920 from the image, thereby addressing the field curvature problem. Such field flattened images provide superior image performance, allow for the manufacture of array cameras with relaxed through-the-lens (TTL) requirements, and deliver very homogeneous MTF. However, one problem with this approach is that this field flattening approach intrinsically requires a high CRA. This makes the technique unsuitable for conventional camera light-sensitive sensors; however, camera arrays using a light sensitive quantum film in accordance with embodiments of the invention can be constructed with a relaxed CRA angle requirement, thereby allowing for the use of the negative lens element field flattening approach shown in FIG. 9. Accordingly, in some embodiments of a camera incorporating a light sensitive quantum film a negative lens element is included in the lens stack above the focal plane.

Although an embodiment of an optical arrangement for use in an array camera that captures images using a distributed approach using a quantum film sensor is described above, it should be understood that other optical elements and arrangements may be fabricated for use with embodiments of the array camera. Embodiments where various lens stacks are incorporated into array cameras is further discussed in U.S. patent application Ser. No. 13/536,520 entitled "Optical Arrangements for Use With An Array Camera" filed Jun. 28, 2012, the disclosure of which is incorporated by reference herein in its entirety.

Imager Array Control

Figure 10:
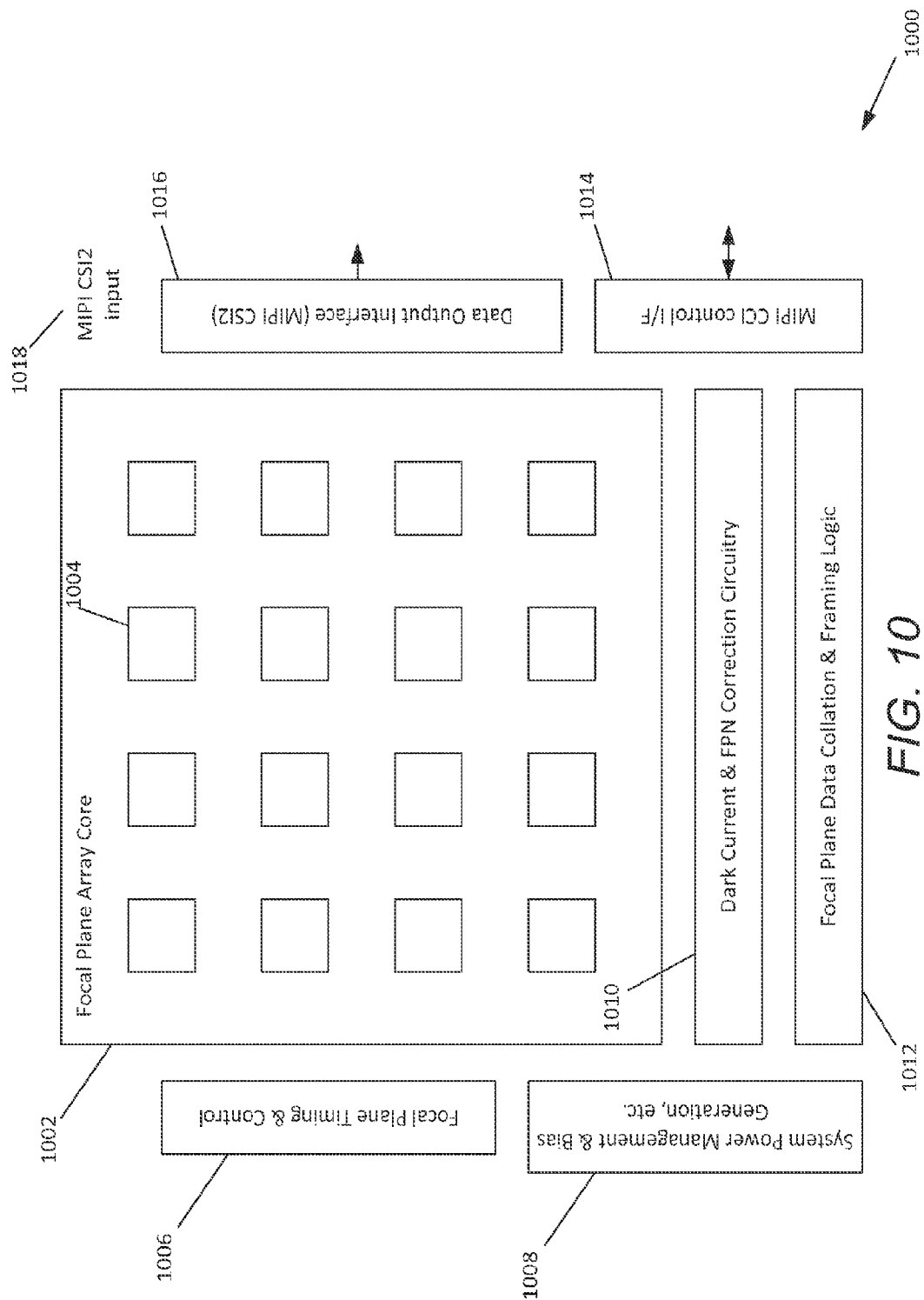
FIG. 10 is a block diagram of an imager array in accordance with an embodiment of the invention.

An imager array in which the image capture settings of a plurality of focal planes can be independently configured in accordance with an embodiment of the invention is illustrated in FIG. 10. The imager array 1000 includes a focal plane array core 1002 that includes an array of focal planes 1004 and all analog signal processing, pixel level control logic, signaling, and analog-to-digital conversion (ADC) circuitry. The imager array also includes focal plane timing and control circuitry 1006 that is responsible for controlling the capture of image information using the pixels. In a number of embodiments, the focal plane timing and control circuitry utilizes reset and read-out signals to control the integration time of the pixels. In other embodiments, any of a variety of techniques can be utilized to control integration time of pixels and/or to capture image information using pixels. In many embodiments, the focal plane timing and control circuitry 1006 provides flexibility of image information capture control, which enables features including (but not limited to) high dynamic range imaging, high speed video, and electronic image stabilization. In various embodiments, the imager array includes power management and bias generation circuitry 1008. The power management and bias generation circuitry 1008 provides current and voltage references to analog circuitry such as the reference voltages against which an ADC would measure the signal to be converted against. In many embodiments, the power management and bias circuitry also includes logic that turns off the current/voltage references to certain circuits when they are not in use for power saving reasons. In several embodiments, the imager array includes dark current and fixed pattern (FPN) correction circuitry 1010 that increases the consistency of the black level of the image data captured by the imager array and can reduce the appearance of row temporal noise and column fixed pattern noise. In several embodiments, each focal plane includes reference pixels for the purpose of calibrating the dark current and FPN of the focal plane and the control circuitry can keep the reference pixels active when the rest of the pixels of the focal plane are powered down in order to increase the speed with which the imager array can be powered up by reducing the need for calibration of dark current and FPN.

In many embodiments, a single self-contained chip imager includes focal plane framing circuitry 1012 that packages the data captured from the focal planes into a container file and can prepare the captured image data for transmission. In several embodiments, the focal plane framing circuitry includes information identifying the focal plane and/or group of pixels from which the captured image data originated. In a number of embodiments, the imager array also includes an interface for transmission of captured image data to external devices. In the illustrated embodiment, the interface is a MIPI CSI 2 output interface (as specified by the non-profit MIPI Alliance, Inc.) supporting four lanes that can support read-out of video at 30 fps from the imager array and incorporating data output interface circuitry 1016, interface control circuitry 1016 and interface input circuitry 1018. Typically, the bandwidth of each lane is optimized for the total number of pixels in the imager array and the desired frame rate. The use of various interfaces including the MIPI CSI 2 interface to transmit image data captured by an array of imagers within an imager array to an external device in accordance with embodiments of the invention is described in U.S. Pat. No. 8,305,456, entitled "Systems and Methods for Transmitting Array Camera Data", issued Nov. 6, 2012, the disclosure of which is incorporated by reference herein in its entirety.

Although specific components of an imager array architecture are discussed above with respect to FIG. 10, any of a variety of imager arrays can be constructed in accordance with embodiments of the invention that enable the capture of images of a scene at a plurality of focal planes in accordance with embodiments of the invention. Independent focal plane control that can be included in imager arrays in accordance with embodiments of the invention are discussed further below.

Independent Focal Plane Control

Imager arrays in accordance with embodiments of the invention can include an array of focal planes that can independently be controlled. In this way, the image capture settings for each focal plane in an imager array can be configured differently. The ability to configure active focal planes using difference image capture settings can enable different cameras within an array camera to make independent measurements of scene information that can be combined for use in determining image capture settings for use more generally within the camera array.

Figure 11:
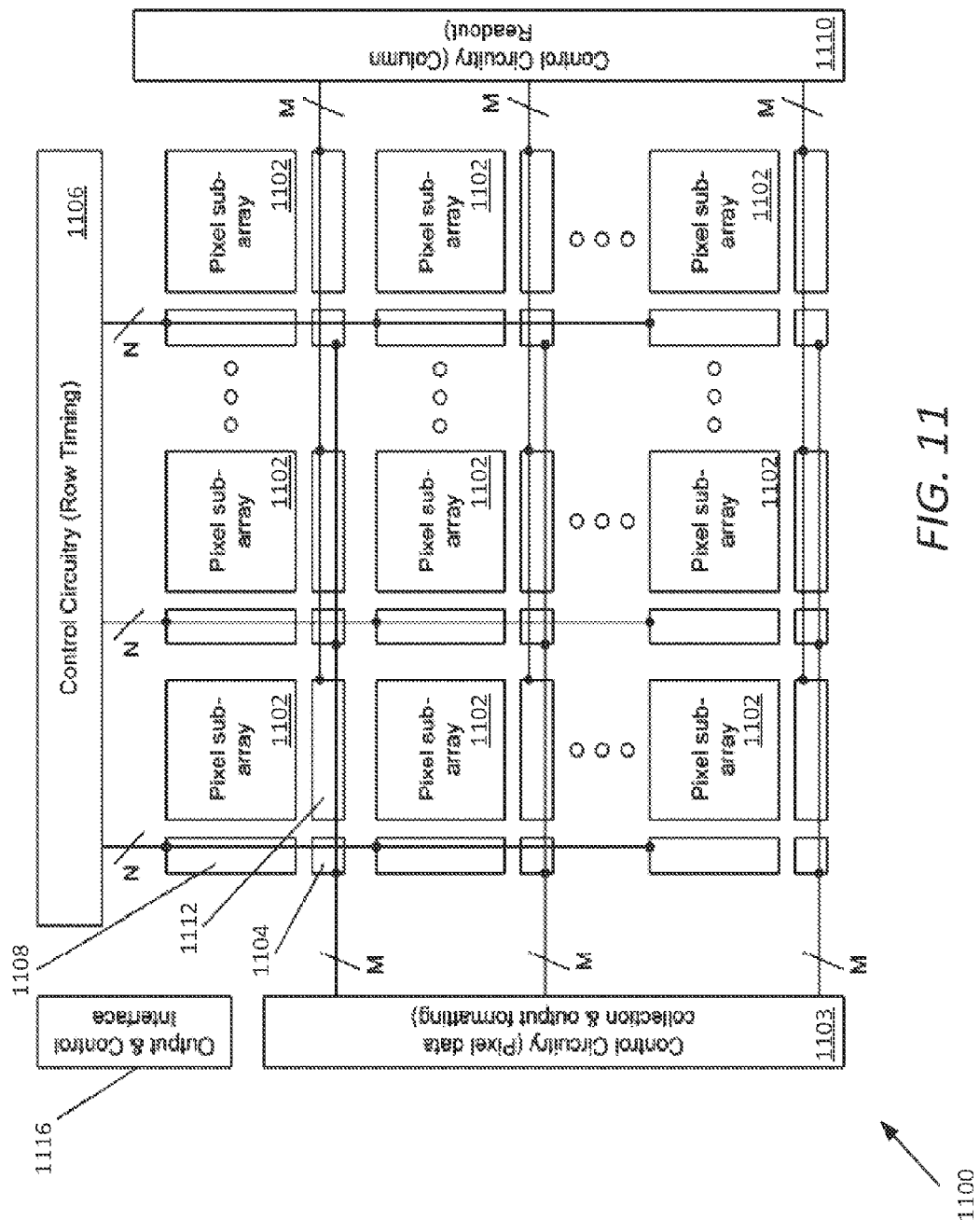
FIG. 11 is a high level circuit diagram of pixel control and readout circuitry for a plurality of focal planes in an imager array in accordance with an embodiment of the invention.

An imager array including independent control of image capture settings and independent control of pixel readout in an array of focal planes in accordance with an embodiment of the invention is illustrated in FIG. 11. The imager array 1100 includes a plurality of focal planes or pixel sub-arrays 1102. Control circuitry 1103, 1104 provides independent control of the exposure timing and amplification gain applied to the individual pixels within each focal plane. Each focal plane 1102 includes independent row timing circuitry 1106, 1108, and independent column readout circuitry 1110, 1112. In operation, the control circuitry 1103, 1104 determines the image capture settings of the pixels in each of the active focal planes 1102. The row timing circuitry 1106, 1108 and the column readout circuitry 1110, 1112 are responsible for reading out image data from each of the pixels in the active focal planes. The image data read from the focal planes is then formatted for output using an output and control interface 1116.

Although specific imager array configurations are discussed above with reference to FIG. 11, any of a variety of imager array configurations including independent and/or related focal plane control can be utilized in accordance with embodiments of the invention including those outlined in U.S. patent application Ser. No. 13/106,797, entitled "Architectures for Imager Arrays and Array Cameras", filed May 12, 2011, the disclosure of which is incorporated by reference herein in its entirety. The use of independent focal plane control to capture image data using array cameras is discussed further below.

While the above description contains many specific embodiments of the invention, these should not be construed as limitations on the scope of the invention, but rather as an example of one embodiment thereof. It is therefore to be understood that the present invention may be practiced otherwise than specifically described, without departing from the scope and spirit of the present invention. Thus, embodiments of the present invention should be considered in all respects as illustrative and not restrictive.

What is claimed is:

1. An array camera module comprising:
    a semiconducting integrated circuit substrate;
    a plurality of focal planes, where each focal plane comprises a plurality of rows of pixels that also form a plurality of columns of pixels and each focal plane is contained within a region of the semiconducting integrated circuit substrate that does not contain pixels from another focal plane;
    at least one quantum film associated with one of the plurality of focal planes, located on the surface of the semiconducting integrated circuit substrate, where each quantum film comprises a plurality of quantum dots;
        wherein the at least one quantum film includes only quantum dots that are sensitive to a specific portion of the electromagnetic spectrum that approximately corresponds to wavelengths characterized as one of: X-ray radiation, ultraviolet radiation, visible radiation, and near infrared radiation;
    control circuitry configured to control the capture of image information by the pixels within the focal planes, where the control circuitry is configured so that the capture of image information by the pixels in at least two of the focal planes is separately controllable; and
    sampling circuitry configured to convert pixel outputs into digital pixel data; and
    a set of microlenses positioned over the at least one quantum film, wherein each microlens of the set of microlenses focuses light onto a single pixel of a first focal plane of the plurality of focal planes, wherein each microlens of the set of microlenses has a chief ray angle (CRA) greater than a first CRA necessary to focus incoming light onto a light sensitive element within the semiconducting integrated circuit substrate and not greater than a second CRA necessary to focus incoming light onto a surface of the at least one quantum film associated with the first focal plane.

2. The array camera module of claim 1, wherein at least one quantum film includes only quantum dots that are sensitive to the green spectral band of the visible electromagnetic spectrum.

3. The array camera module of claim 2, wherein at least one quantum film includes only quantum dots that are sensitive to the red spectral band of the visible electromagnetic spectrum.

4. The array camera module of claim 3, wherein at least one quantum film includes only quantum dots that are sensitive to the blue spectral band of the visible electromagnetic spectrum.

5. The array camera module of claim 4, wherein the plurality of focal planes are arranged so that they define a 3×3 matrix of focal planes.

6. The array camera module of claim 5, wherein each of the focal planes within the 3×3 matrix of focal planes includes a quantum film that includes quantum dots that are sensitive to one of: the green spectral band of the visible electromagnetic spectrum, the red spectral band of the visible electromagnetic spectrum, and the blue spectral band of the visible electromagnetic spectrum.

7. The array camera module of claim 6, wherein the 3×3 matrix of focal planes is arranged as follows:
    quantum films that include quantum dots that are sensitive to the green spectral band of the visible electromagnetic spectrum are disposed at each of the corner locations of the 3×3 matrix of focal planes and the center focal plane within the 3×3 matrix of focal planes;

quantum films that include quantum dots that are sensitive to the red spectral band of the visible electromagnetic spectrum are disposed at each of two opposite sides of the 3×3 matrix of focal planes; and quantum films that include quantum dots that are sensitive to the blue spectral band of the visible electromagnetic spectrum are disposed at each of two opposite sides of the 3×3 matrix of focal planes.

* * * * *